United States Patent
Togashi et al.

(10) Patent No.: US 6,958,899 B2
(45) Date of Patent: Oct. 25, 2005

(54) ELECTRONIC DEVICE

(75) Inventors: Masaaki Togashi, Tokyo (JP); Taisuke Ahiko, Akita-ken (JP); Akitoshi Yoshii, Tokyo (JP); Atsushi Takeda, Akita-ken (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/801,851

(22) Filed: Mar. 17, 2004

(65) Prior Publication Data
US 2004/0183147 A1 Sep. 23, 2004

(30) Foreign Application Priority Data

Mar. 20, 2003 (JP) .......................................... 2003-078509
May 12, 2003 (JP) .......................................... 2003-133302

(51) Int. Cl.[7] .............................................. H01G 4/005
(52) U.S. Cl. ...................... 361/303; 361/306.1; 361/310
(58) Field of Search ............................... 361/303, 306.1, 361/306.3, 308.1, 309, 310, 311–313, 328–329

(56) References Cited

U.S. PATENT DOCUMENTS 6,181,544 B1 * 1/2001 Nakagawa et al. ...... 361/321.1
6,191,933 B1 * 2/2001 Ishigaki et al. ............. 361/309
6,288,887 B1 * 9/2001 Yoshida et al. ........... 361/306.1
6,704,189 B2 * 3/2004 Yoshii et al. ............. 361/308.1

FOREIGN PATENT DOCUMENTS

| JP | A 11-74147 | 3/1999 |
| JP | A 2000-235931 | 8/2000 |
| JP | A 2000-306764 | 11/2000 |
| JP | PB 2001-185446 | * 6/2001 |
| JP | A 2001-185446 | 7/2001 |
| JP | A 2002-231569 | 8/2002 |

* cited by examiner

Primary Examiner—Anthony Dinkins
(74) Attorney, Agent, or Firm—Oliff & Berridge, PLC

(57) ABSTRACT

Terminal electrodes 11 and 12 of a main body 2 of a multilayer capacitor 1 are connected to electrode connection parts 21A and 22A of a pair of external terminals 21 and 22 formed by a metal material. At the bottom part of the electrode connection part 21A, an external connection part 21B connected to the electrode connection part 21A is formed. At the bottom part of the electrode connection part 22A, an external connection part 22B connected to the electrode connection part 22A is formed. The widths of the terminal electrodes 11 and 12 and the widths of the external connection parts 21B and 22B are substantially the same, but the widths of the electrode connection parts 21A and 22A are formed narrower. Due to this, propagation of vibration can be suppressed and generation of noise reduced.

21 Claims, 22 Drawing Sheets

FIG. 5
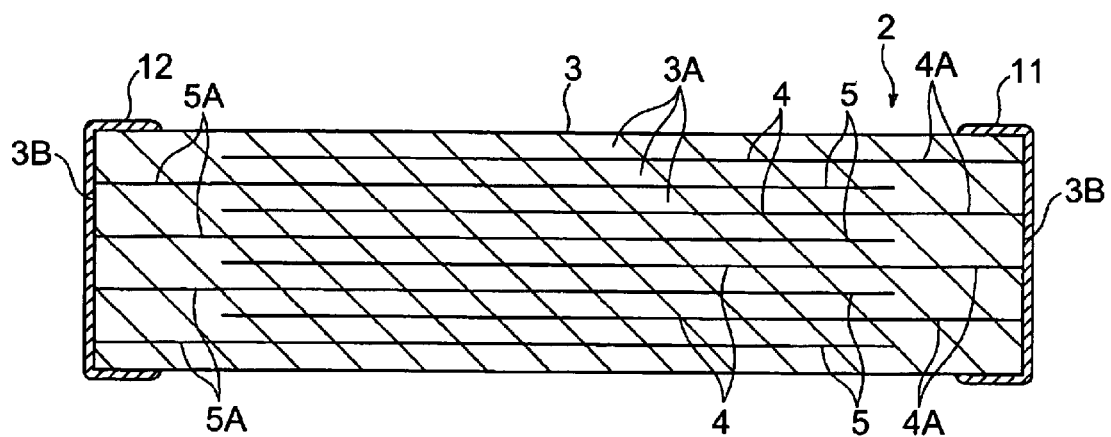
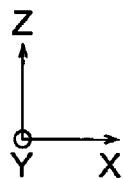

FIG. 19
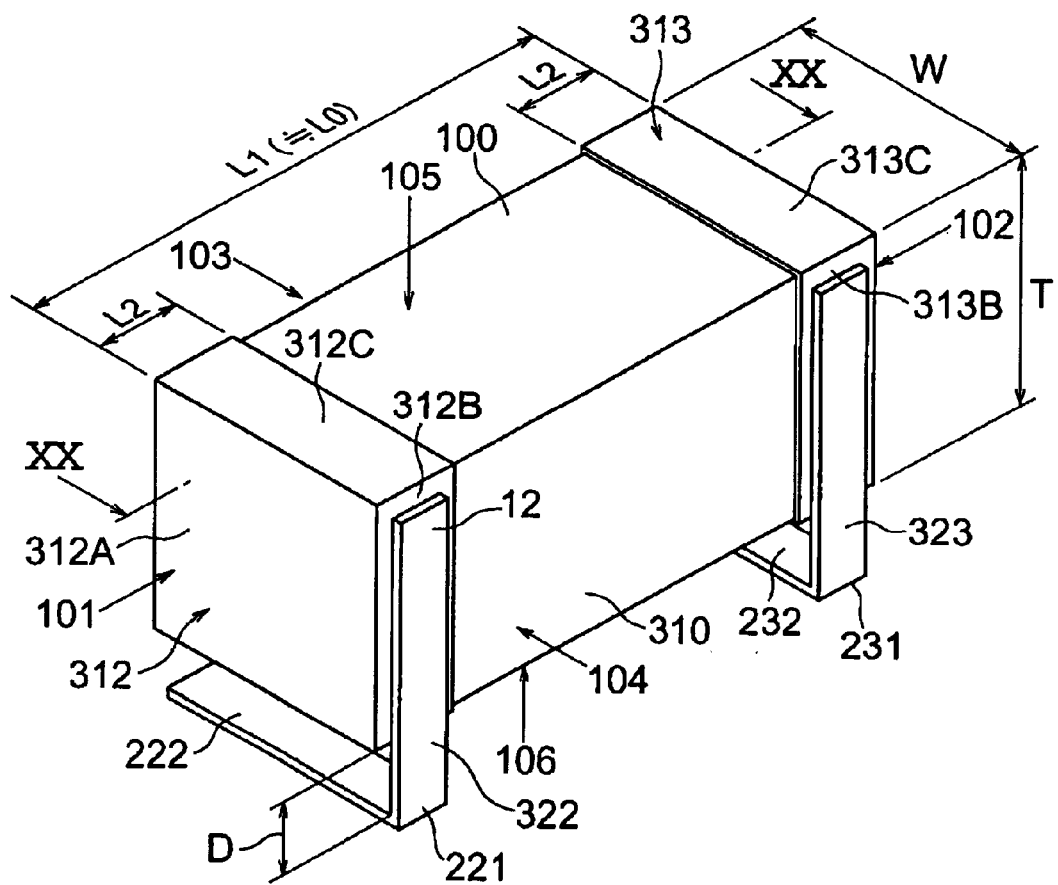
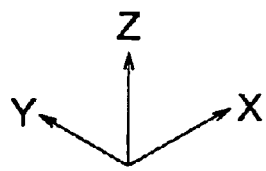

ELECTRONIC DEVICE

BACKGROUND OF THE INVENTION

1. Field of the Invention

The present invention relates to an electronic device able to suppress propagation of vibration caused by piezoelectric and electrostriction phenomena and thereby reduce noise, more particularly relates to a ceramic capacitor used for an audio circuit or other circuit sensitive to noise or used for a smoothing capacitor for a switching power source.

2. Description of the Related Art

There have been remarkable advances in technology for reducing the thickness of layers and technology for increasing the number of layers of multilayer ceramic capacitors in recent years. Capacitors having high electrostatic capacities comparable to those of aluminum electrolytic capacitors have been marketed. As the ceramic materials for forming the stacks of such multilayer ceramic capacitors, barium titanate and other ferroelectric materials having relatively high dielectric constants are generally used.

Such ferroelectric materials, however, have piezoelectric and electrostriction properties, so stress and mechanical strain are caused when the ferroelectric materials are subjected to an electric field. Further, when an AC voltage is applied to a multilayer ceramic capacitor using such a ferroelectric material, the stress and mechanical strain caused in synchronization with the frequency of the AC voltage is manifested as vibration. This vibration is transmitted from the terminal electrodes of the multilayer ceramic capacitor to the board side.

For example, in a conventional multilayer ceramic capacitor, two types of internal electrodes are alternately arranged in the stack. The ends of the stack are provided with a pair of terminal electrodes connecting to these internal electrodes. These terminal electrodes are connected to interconnect patterns on the board by for example solder, whereby the multilayer ceramic capacitor is mounted on the board.

When applying an AC voltage to a multilayer ceramic capacitor, stresses Fx, Fy, and Fz occur at the main body of the multilayer ceramic capacitor along the X-, Y-, and Z-directions, whereby vibration occurs. This vibration is transmitted from the terminal electrodes to the board, whereby the board as a whole becomes a sound reflecting surface and a buzzing sound is liable to be generated as noise. This buzzing noise is sometimes noise of an audible frequency (20 to 20000 Hz). The buzzing noise is unpleasant to humans in some cases. Countermeasures are therefore required.

Further, such buzzing noise has a detrimental effect on the performance and quality of apparatuses having audio circuits or other circuits sensitive to noise. Accordingly, use of multilayer ceramic capacitors using ferroelectric materials for such apparatuses has generally been avoided.

Note that for example as shown in Japanese Unexamined Patent Publication(A) No. 2000-306764, Japanese Unexamined Patent Publication(A) No. 11-74147, Japanese Unexamined Patent Publication(A) No. 11-74147, Japanese Unexamined Patent Publication(A) No. 2002-231569, Japanese Unexamined Patent Publication(A) No. 2001-185446, and Japanese Unexamined Patent Publication(A) No. 2000-235931, technology for preventing vibration by the elastic deformation of the external terminals of multilayer ceramic capacitors has been disclosed.

However, in such multilayer ceramic capacitors, the fact is that the external terminals are high in rigidity and a sufficient effect of preventing vibration has not been obtained.

SUMMARY OF THE INVENTION

An object of the present invention is to provide an electronic device able to suppress propagation of vibration arising due to piezoelectric and electrostriction phenomena and thereby reduce the generation of noise. Another object of the present invention is to provide a ceramic capacitor or other electronic device able to suppress transmission of vibration to a circuit board etc. by a simple structure.

To achieve the above objects, according to a first aspect of the present invention, there is provided an electronic device comprising:

a main body including ceramic layers and internal conductor layers, a terminal electrode formed at end face of the main body and connected to said internal conductor layer, and an external electrode comprised of a conductive sheet member formed with electrode connection part connected to the outer end face of said terminal electrode and external connection part able to be connected to an external circuit, wherein a width of said electrode connection part is narrower than a width of said external connection part and is narrower than a width of said terminal electrode, said external connection part is arranged so as to face a bottom surface of said main body by a predetermined separation distance from said main body, and, when a width dimension of said main body is W0 and a height dimension of said main body is T, said main body is designed so that the value of W0/T becomes one in the range of 0.8 to 1.2.

In the electronic device according to the first aspect of the present invention, the electronic device is mounted on an external board etc. by connection of the external connection parts to interconnect patterns of the board (external circuits). In the electronic device of the present invention, along with the application of an AC current to the electronic device, vibration occurs due to the piezoelectric and electrostriction phenomenon of the main body. However, with the electronic device of the present invention, the width of the electrode connection part connected to the terminal electrode of the main body is narrower than the width of the external connection part to be connected to the external board etc. and narrower than the width of the terminal electrode. Therefore, vibration is absorbed by flexing etc. of the electrode connection part formed to the narrower width and raised in springiness. Due to this, the propagation of vibration to the external board forming the sound reflecting surface is suppressed and the generation of noise from the board is reduced.

Further, in the electronic device, the external connection part is arranged so as to face the bottom surface of the main body by a predetermined separation distance from the main body. The bottom surface of the main body is substantially parallel to the internal conductor layers of the main body. Accordingly, vibration of the main body occurring in a direction parallel to the internal conductor layers can be easily absorbed by flexing of the external connection part. Therefore, the transmission of vibration of the main body to the board can be more reliably suppressed.

That is, in this electronic device, while vibration of the terminal electrode of the main body is transmitted to the external electrode, the vibration transmitted from the external connection part of the external electrode to the external board is reduced and the generation of noise from the board is reduced.

Further, in this electronic device, since the value of W0/T becomes one in the range of 0.8 to 1.2, the width and height of the main body become substantially the same and the two end faces of the main body are formed close to square shapes. Therefore, even with the narrow width electrode connection part at the external terminal, connection with the terminal electrode is possible with a sufficient contact area and poor contact can be prevented. Further, the narrow width electrode connection part of the external terminal contact the terminal electrode with a sufficient length, so the effect of prevention of vibration is also improved.

Preferably, the ratio (W1/W) of the width dimension (W1) of the electrode connection part to the width dimension (W) of the terminal electrode is not more than 0.5. If W1/W is too large, the effect of the present invention tends to become smaller. However, if this W1/W is too small, the holding of the main body tends to become unstable. Accordingly, W1/W is at least 0.1 at the minimum.

Preferably, the electrode connection part is connected at the substantial center of the terminal electrode in the width direction along the height direction of the terminal electrode. By connecting the electrode connection part of the external terminal at the center of the width direction of the terminal electrode, the holding of the main body by the external terminal becomes more secure.

Preferably, the width of the external connection part is substantially the same as the width of the terminal electrode. If the width of the external connection part is too large, this runs against the demand for greater compactness, while if too small, the connection and support with the board and other external circuits tend to become unstable.

Preferably, when the length dimension of the entirety of the electronic device is L1 and the separation distance of the external connection part and the bottom surface of the main body is D, the value of D/L1 is in the range of 0.025 to 0.600.

By making the value of D/L1 the above range, the size of the separation distance becomes suitable in relation to the length of the electronic device as a whole. That is, if the separation distance of the external connection parts and the facing surfaces of the main body is too great with respect to the length of the electronic device as a whole, the amplitude of the vibration is conversely liable to be increased at the electrode connection parts. Further, if the separation distance is too small, the function of the electrode connection parts of reducing the amplitude of the vibration is liable to become insufficient.

Preferably, the terminal electrode is provided at each of two end faces of the main body in the length direction and the external terminals are arranged so as to be connected to the terminal electrodes. That is, the present invention can be applied to general electronic devices such as multilayer capacitors having pairs of terminal electrodes. The generation of noise is reduced even on a board on which various types of electronic devices such as multilayer capacitors are mounted.

Preferably, the terminal electrode of the main body and the electrode connection part of the external terminal are connected by high temperature solder or a conductive adhesive. That is, the terminal electrode of the main body and the external terminal are connected by a high temperature solder or conductive adhesive. As a result, they are connected mechanically while securing conductivity.

Preferably, the base part of the electrode connection part is provided with a bent part. Alternatively, the electrode connection part is formed bent into substantially U-shape. In these cases, the electrode connection part can be made longer without increasing the size of the electronic device including the external terminals more than necessary. The longer electrode connection part can elastically deform more and can more reliably ease vibration.

Preferably, the electrode connection part is provided with a body support supporting the main body and/or the bottom surface of the terminal electrode. By supporting the main body by the body support, the connection between the electrode connection part and terminal electrode is reinforced and the main body can be more reliably fixed to the external terminal.

Further, by providing the body support, positioning of the main body with the external terminal becomes easier. Therefore, when assembling the electronic device, attachment of the external terminal to the main body becomes easy and as a result the cost of production of the electronic device is reduced.

Preferably, the body support is formed at each of two sides of the electrode connection part and is obtained by bending the conductive sheet member forming the external terminal to substantially right angle with respect to the electrode connection part. The body supports formed at the two sides enable the main body to be held while reliably positioned.

Alternatively, the body support may be formed by bending the electrode connection part in step-wise shapes. A support formed bent into such step-wise shapes also enable the main body to be held while reliably positioned.

Alternatively, the body support may be formed by cutting and bending part of the electrode connection part. Such support also enable the main body to be held while reliably positioned.

Alternatively, the top end of the electrode connection part may be provided with guide piece, for facilitating positioning with the main body, formed bent along the top surface of the main body. By forming such guide piece, positioning of the main body and the external terminals becomes easy. Therefore, when assembling the electronic device, attachment of the external terminal to the main body becomes easy and as a result the cost of production of the electronic device is reduced.

To achieve the above objects, according to a second aspect of the present invention, there is provided an electronic device comprising:

a main body including a plurality of internal conductor layers stacked via ceramic layers, a pair of terminal electrodes formed at the two ends of said main body in the longitudinal direction and selectively connected to said internal conductor layers, and a pair of external terminals connected to said terminal electrodes, wherein each of said terminal electrodes has at least electrode end face positioned at the end face of said main body in the longitudinal direction and a electrode side face formed at side face of said main body in the width direction so as to continue from said electrode end face to the side face, and each of said external terminals is comprised of conductive sheet member formed with an electrode connection part connected to at least the electrode side face of said terminal electrode and an external connection part able to be connected to an external circuit.

If applying an AC voltage etc. to the internal conductor layers of the main body, vibration will occur due to the electrostriction phenomenon. However, in the present invention, even if the main body vibrates due to the electrostriction phenomenon, it is possible to reduce the vibration transmitted to the board through the external terminals. Further, the external terminals need only be simple bent structures having electrode connection parts and external connection parts, so the transmission of vibration to a circuit board etc. can be stopped by a simple structure.

Preferably, the external connection part is bent substantially perpendicular to the electrode connection part and is separated from the bottom surface of the main body by a predetermined separation distance. Preferably, when the length dimension of the electronic device is L1 and the separation distance between the external connection part and the bottom surface of the main body is D, the value of D/L1 falls in the range of 0.025 to 0.600. The reason for making the value of D/L1 the above range is the same as the case of the first aspect of the invention.

Preferably, the width (L2) of the electrode side face of the terminal electrodes is sizes of 5% to 20% with respect to the length (L0) of the main body. If the width (L2) is too small, connection of the electrode terminal to the electrode side face of the terminal electrode tends to become difficult, while if too large, formation of the electrode by coating becomes difficult and the material tends to be wasted.

Preferably, the width of the external terminal are the same as or less than the width (L2) of the electrode side face. With such a relationship, connection of the electrode connection part of the external terminal and the electrode side face of the terminal electrode becomes easy.

Preferably, the pair of external terminals are connected to the pair of electrode side faces formed at the one same side face in the width direction of the main body. In such a case, the external terminals support the main body at only one side face, while the other side face becomes a free end side face of vibration, so vibration occurring in the main body can be effectively reduced by the external terminals. Note that in the present invention, it is also possible to hold the main body by the pair of external terminals from the two sides of the main body in the width direction.

Preferably, the electrode connection part of the external terminal further has an end face connection piece to be connected to electrode end face of the terminal electrode. By providing the end face connection piece, the connection between the external terminal and terminal electrode becomes more reliable. Further, the effect of absorption of vibration by the external terminal also is improved.

Preferably, the terminal electrode further has electrode top surface positioned at the top surface of the main body in the height direction, and the electrode connection part of the external terminal further has top surface connection piece to be connected to the electrode top surface of the terminal electrode. By providing the connection piece, the connection between the external terminal and terminal electrode become more reliable. Further, the effect of absorption of vibration also is improved.

Preferably, the terminal electrode further has an electrode bottom surface positioned at the bottom surface of the main body in the height direction. More preferably, the width of the electrode top surface and electrode bottom surface is substantially equal to the width of the electrode side face. The terminal electrode having top surfaces, bottom surfaces, and side faces of the same widths in this way are easy to produce.

Preferably, when a width dimension of the main body is W0 and a height dimension of the main body is T, the main body is designed so that the value of W0/T becomes one in the range of 0.8 to 1.2. The reason is the same as the first aspect of the present invention.

In the present invention, the electrode connection part of the external terminal may also be connected to electrode side faces of terminal electrodes of a plurality of main bodies stacked along the height direction.

In this case, when a width dimension of the main bodies is W0 and a total height dimension of the plurality of main bodies is T, the main bodies are designed so that the value of W0/T becomes one in the range of 0.8 to 1.2.

According to the second aspect of the present invention, the external connection part of the external terminal may also be formed on the same plane as the end face connection piece.

BRIEF DESCRIPTION OF THE DRAWINGS

Next, the present invention will be explained in further detail with reference to embodiments shown in the drawings, wherein:

FIG. 5 is a cross-sectional view of a capacitor main body shown in FIG. 1;

FIG. 19 is a perspective view of a ceramic capacitor according to another embodiment of the present invention;

DESCRIPTION OF THE PREFERRED EMBODIMENTS

First Embodiment

Figure 1:
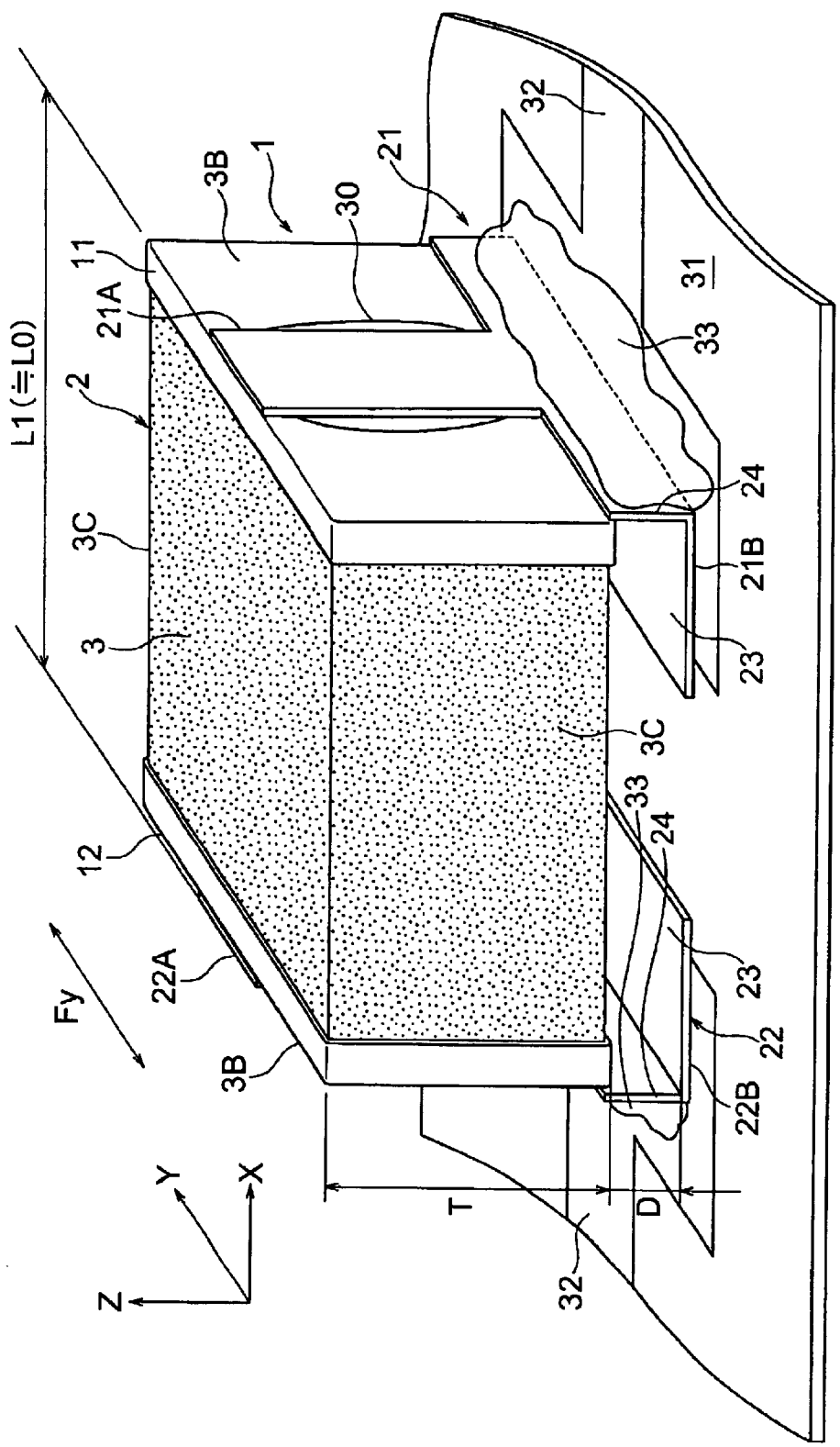
FIG. 1 is a perspective view of the state of a multilayer capacitor according to a first embodiment of the present invention mounted on a board.

An electronic device according to a first embodiment of the present invention constituted by a multilayer capacitor 1 is shown in FIG. 1 to FIG. 5. This capacitor 1 has a capacitor body (hereinafter sometimes simply referred to as a "body"). This body 2 has as its main part a dielectric body (main body) 3 comprised of a parallelepiped shaped sintered body obtained by firing a stack of a plurality of ceramic green sheet members.

As shown in FIG. 5, the dielectric body 3 of the body 2 includes ceramic layers 3A and internal conductor layers 4 and 5. The internal conductor layers 4 and 5 are arranged alternately in the stacking direction (also called "height direction") Z via the ceramic layers 3A. The number of the internal conductor layers 4 and 5 stacked is not particularly limited, but for example is about 100.

The centers of these internal conductor layers 4 and internal conductor layers 5 are arranged to be at substantially the same positions as the centers of the ceramic layers 3A. Further, the length and width dimensions of the internal conductor layers 4 and internal conductor layers 5 are made smaller than the lengths of the corresponding sides of the ceramic layers 3A.

The internal conductor layers 4 and 5 have leadout parts 4A and 5A. The widths of these leadout parts 4A and 5A are substantially the same as the widths of the internal conductor layers 4 and 5. The leadout parts 4A of the internal conductor layers 4 are connected to a terminal electrode 11 formed at one end face 3B of the dielectric body 3 in the longitudinal direction X. The leadout parts 5A of the internal conductor layers 5 are connected to a terminal electrode 12 formed at the other end face 3B of the dielectric body 3 in the longitudinal direction X.

As the material of the internal conductor layers 4 and 5 formed in substantially rectangular shapes, not only base metals such as nickel, nickel alloys, copper, and copper alloys, but also materials mainly comprised of these metals may be considered.

Figure 2:
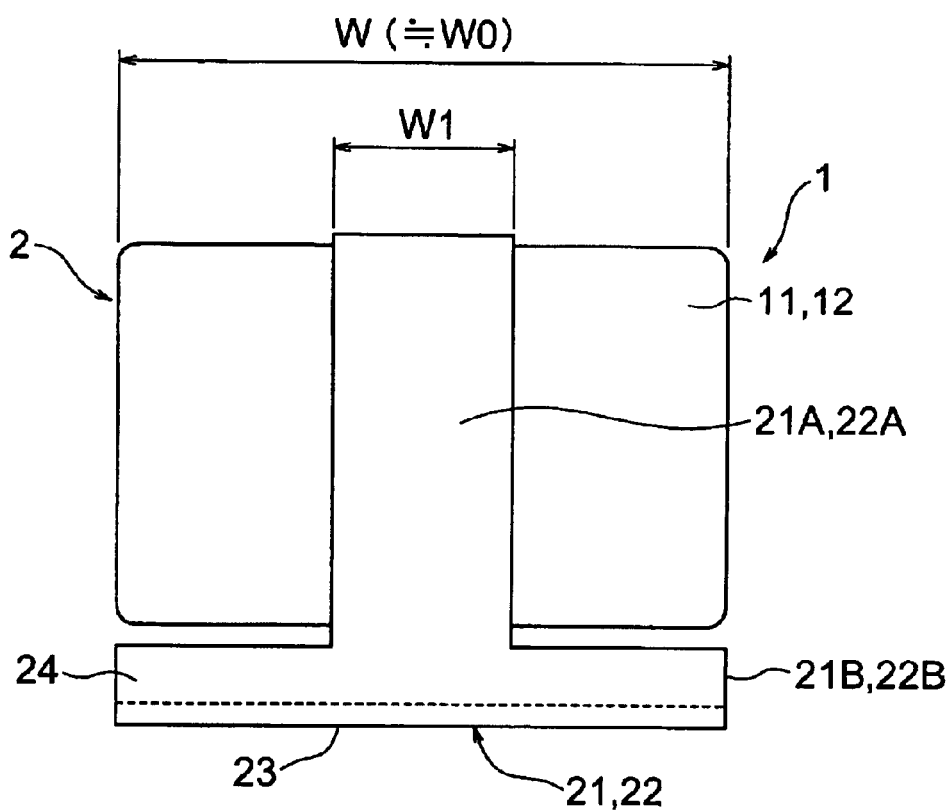
FIG. 2 is a side view of the multilayer capacitor shown in FIG. 1.
Figure 3:
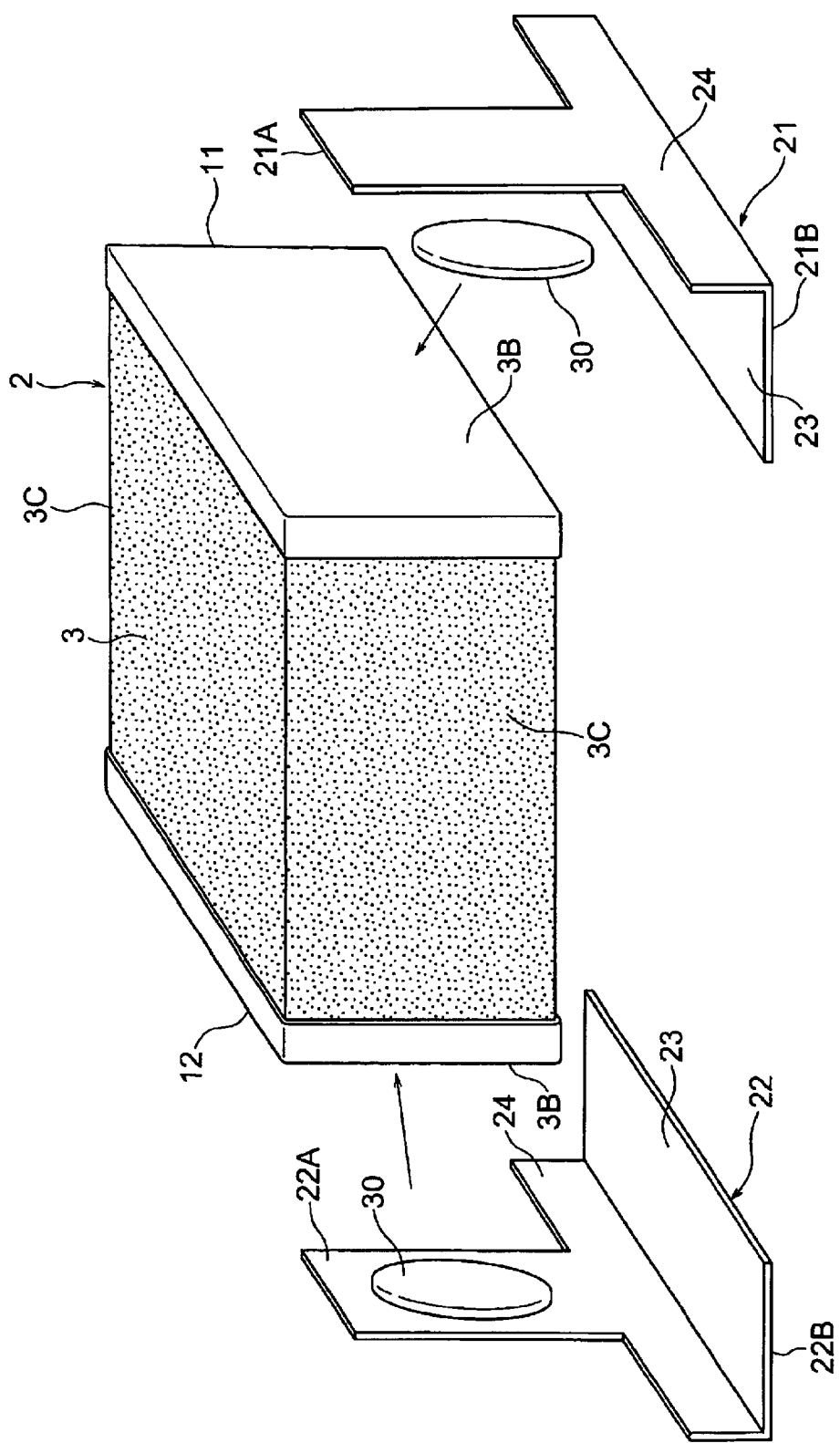
FIG. 3 is a disassembled perspective view of the multilayer capacitor shown in FIG. 1.
Figure 4:
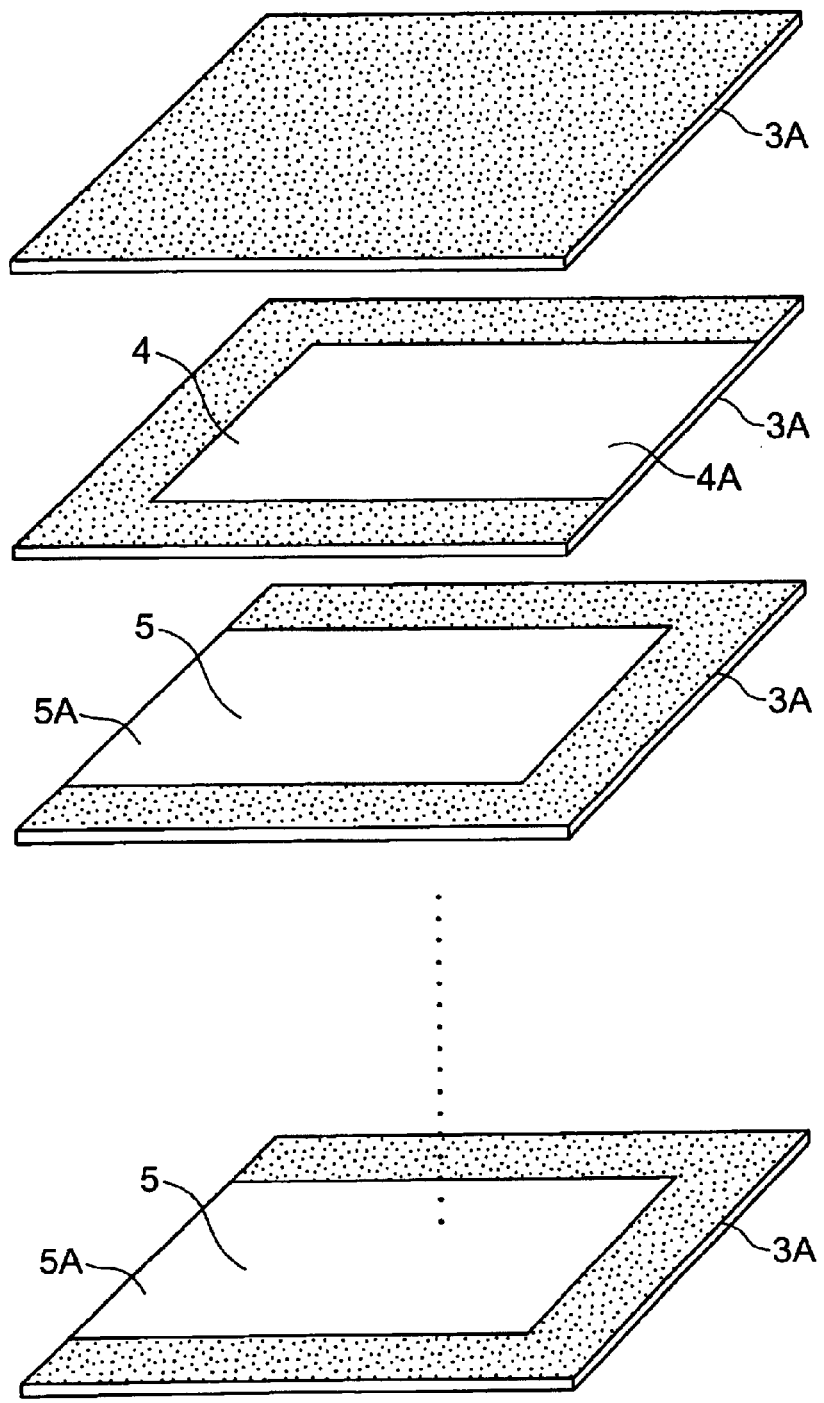
FIG. 4 is a disassembled perspective view of a capacitor main body shown in FIG. 1.

As shown in FIG. 1 to FIG. 3, the two end faces 3B of the dielectric body 3 in the longitudinal direction are connected to external terminals 21 and 22. The external terminals 21 and 22 are comprised of conductive sheet members formed with electrode connection parts 21A and 22B connected to external end faces of the terminal electrodes 11 and 12 and external connection parts 21B and 22B able to be connected to land patterns 32 of a board 31 constituting an external circuit.

For connecting the electrode connection parts 21A and 22A and the terminal electrodes 11 and 12, a bonding material 30 shown in FIG. 1 and FIG. 3 is used. As this bonding material 30, high temperature solder is for example used. It is also possible however to use a conductive adhesive containing a resin instead of this high temperature solder so as to connect the pair of terminal electrodes 11 and 12 and the pair of electrode connection parts 21A and 22A.

As shown in FIG. 1 and FIG. 3, the external terminal 21 has a plate-shaped electrode connection part 21A connected to the terminal electrode 11 through the bonding material 30. Further, the external terminal 22 has a plate-shaped electrode connection part 22A connected to the terminal electrode 12 through the bonding material 30. At the lower part of the electrode connection part 21A, an external connection part 21B connected to the electrode connection part 21A is arranged. Similarly, at the lower part of the electrode connection part 22A, an external connection part 22B connected to the electrode connection part 22A is arranged.

The parts of these external connection parts 21A and 22B near the bottom are bent at right angles to the top parts of the external connection parts 21B and 22B toward the bottom surface side of the capacitor body 2. The surfaces of the external connection parts 21B and 22B near the top are made vertical surfaces 24 extending in the vertical direction, while the surfaces of the external connection parts 21B and 22B near the bottom are made abutting surfaces 23 able to abut against the board 31. That is, the pair of external terminals 21 and 22 are formed into L-shaped structures respectively. The abutting surfaces 23 of the external connection parts 21B and 22B are arranged facing the bottom surface of the dielectric body 3 at a predetermined distance D from the bottom surface.

As shown in FIG. 2, the widths of the terminal electrodes 11 and 12 and the external connection parts 21B and 22B are substantially the same. The widths of the electrode connection parts 21A and 22A positioned above the external connection parts 21B and 22B are formed narrower than this. If viewing the external terminals 21 and 22 from the side, they form inverted T-shapes. In the present embodiment, the width dimensions W1 of the electrode connection parts 21A and 22A are made 1.25 mm, the width dimensions W of the terminal electrodes 11 and 12 are made 2.5 mm, so the ratio of the width dimensions W to the width dimensions W1 (W1/W) becomes not more than 0.5. Note that the width dimensions W of the terminal electrodes 11 and 12 are substantially equal to the width W0 of the dielectric body 3. The electrode connection parts 21A and 22A extend along the vertical direction Z at the substantial centers of the terminal electrodes 11 and 12 in the width direction.

Further, in the present embodiment, when the height dimension of the capacitor body 2 shown in FIG. 1 is T, the length dimension of the multilayer capacitor 1 as a whole is L1, and the separation distance between the external connection parts 21B and 22B and the facing surfaces of the capacitor body 2 facing the external connection parts 21B and 22B is D, the value of W0/T is made one in the range of 0.8 to 1.2 and the value of D/L1 is made one in the range of 0.025 to 0.600. Note that the length dimension L1 of the multilayer capacitor 1 as a whole and the length L0 of the dielectric body 3 are substantially equal.

The external connection parts 21B and 22B are designed to be able to be connected to external circuits. In the present embodiment, the external connection parts 21B and 22B are connected to land patterns 32 forming circuits on the board 31 by for example solder 33 so that the internal conductor layers 4 and 5 of the multilayer capacitor 1 shown in FIG. 5 become electrodes of the capacitor.

When producing the metal external terminals 21 and 22, first the external terminals 21 and 22 are punched out from a metal sheet material and bent to form external terminals 21 and 22 of the structures shown in FIG. 3. Further, the pair of external terminals 21 and 22 are bonded to circumference of the capacitor body 2 by the bonding material 30, whereby the multilayer capacitor 1 shown in FIG. 1 and FIG. 2 is completed.

Further, as the material of the pair of external terminals 21 and 22 forming the multilayer capacitor 1 according to the present embodiment, it may be considered to use steel or copper as a metal material, but another metal may also be used so long as it has conductivity and elasticity. Further, the external terminals may also be plated.

Next, the action of the multilayer capacitor 1 according to the present embodiment will be explained. In the multilayer capacitor 1 according to the present embodiment, the widths of the electrode connection parts 21A and 22A are formed narrower than the widths of the external connection parts 21B and 22B and the widths of the terminal electrodes 11 and 12. Further, the external connection parts 21B and 22B are connected to land patterns 32 of interconnect patterns of the external board 31 by solder 33 so that, as shown in FIG. 1, the multilayer capacitor 1 is mounted on the external board 31.

Further, in the present embodiment, the abutting surfaces 23 of the external connection parts 21B and 22B are arranged so as to face the internal conductor layers 4 and 5 a distance away from the capacitor body 2. The ratio between the width dimension W of the capacitor body 2 and the height dimension T of the capacitor body 2, that is, the value of W/T, is within the range of 0.8 to 1.2. That is, the width and height of the capacitor body 2 are substantially the same. The end faces of the capacitor body 2 are therefore close to square in shape.

If an AC voltage is applied to the multilayer capacitor 1, stress will be generated due to the piezoelectric and electrostriction phenomena of the capacitor body 2. Along with this, vibration will be generated. However, in the present embodiment, the widths of the electrode connection parts 21A and 22A connected to the terminal electrodes 11 and 12 of the capacitor body 2 are narrower than the widths of the external connection parts 21B and 22B and narrower than the widths of the terminal electrodes 11 and 12. Due to this, vibration is absorbed by the flexing and other elastic deformation of the narrowly formed electrode connection parts 21A and 22A, propagation of vibration to the external board 31 forming a sound reflecting surface is suppressed, and the generation of noise from the board 31 is reduced.

Further, the abutting surfaces 23 of the external connection parts 21B and 22B of the external terminals 21 and 22 according to the present embodiment are arranged facing the internal conductor layers 4 and 5 so as to become parallel to the planes of the internal conductor layers 4 and 5. Therefore, the vibration of the capacitor body 2 arising in the direction parallel to the internal conductor layers 4 and 5 (X- and Y-directions in FIG. 1) can be easily absorbed by the flexing of the external connection parts 21A and 22A. Accordingly, propagation of vibration of the capacitor body to the board can be more reliably suppressed.

That is, in the present embodiment, while vibration is transmitted from the terminal electrodes 11 and 12 of the capacitor body 2 to the pair of external terminals 21 and 22, the vibration transmitted from the external connection parts 21B and 22B of the pair of external terminals 21 and 22 to the external board 31 is reduced and the generation of noise from the board 31 is reduced. Further, at that time, by making the widths of the electrode connection parts 21A and 22A smaller as in the present embodiment, the stress Fy in the Y-direction among the X-, Y-, and Z-directions shown in FIG. 1 is particularly reduced.

Further, in the present embodiment, the external connection parts 21B and 22B are comprised of abutting surfaces 23 and vertical surfaces 24 at right angles to each other. Therefore, it is possible to place the abutting surfaces 23 against the external board 31 to support the multilayer capacitor 1 and connect to the board 31 by solder 33 by the other vertical surfaces 24. As a result, according to this embodiment, it becomes possible to attach the multilayer capacitor 1 reliably and stably to the external board 31.

Further, by making the widths of the electrode connection parts 21A and 22A narrower to make the width dimensions W1 of the electrode connection parts 21A and 22A not more than 0.5 time the width dimensions W of the terminal electrodes 11 and 12, the electrode connection parts 21A and 22A flex more easily. Along with this, propagation of vibration to the external board 31 is more reliably suppressed and the generation of noise from the board 31 is reduced more.

Further, in the multilayer capacitor 1 according to the present embodiment, the pair of terminal electrodes 11 and 12 of the capacitor body 2 and the pair of external terminals 21 and 22 are connected by a bonding material 30 comprised of high temperature solder, a conductive adhesive, etc., so they are connected mechanically while maintaining conductivity. Further, as the high temperature solder in the present embodiment, for example eutectic solder melting at a temperature of 250° C. etc. may be considered. Further, as the conductive adhesive, for example a heat curing adhesive may be considered.

Second Embodiment

Figure 6:
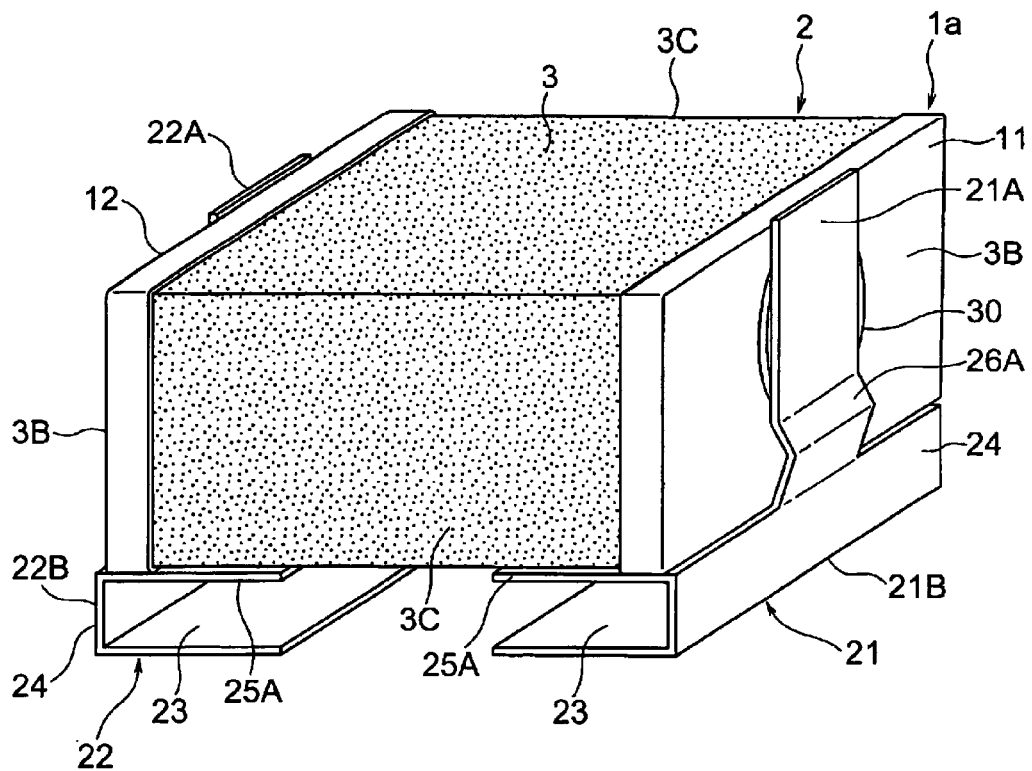
FIG. 6 is a perspective view of a multilayer capacitor according to a second embodiment of the present invention.
Figure 7:
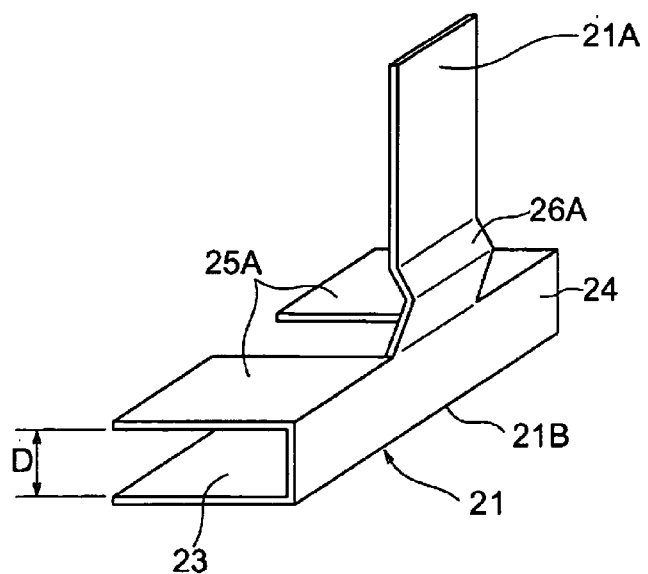
FIG. 7 is a perspective view of an external terminal used in the multilayer capacitor shown in FIG. 6.

Next, an electronic device according to a second embodiment of the present invention constituted by a multilayer capacitor 1a will be shown in FIG. 6 and FIG. 7. Members the same as members explained in the first embodiment are assigned to same notations and overlapping explanations omitted.

The capacitor 1a of this embodiment has substantially the same structure as the capacitor 1 of the first embodiment. However, as shown in FIG. 6 and FIG. 7, in the present embodiment, the external terminals 21 and 22 have pairs of body supports 25A and 25A. The pairs of body supports are positioned at the two sides of the terminal connection parts 21A and 22A and are formed by bending at substantially right angles to the terminal connection parts 21A and 22A.

These body supports 25A are bent parallel to the external connection parts 21B and 22B and maintain predetermined distances D from the external connection parts 21B and 22B. These body supports 25A are formed integrally with the external connection parts 21B and 22B and the electrode connection parts 21A and 22A by cutting and bending from single sheet members.

Further, in this embodiment, the base parts of the electrode connection parts 21A and 22A (parts connecting with external connection parts 21B and 22B) are provided with bent parts 26A bulging outward. The electrode connection parts 21A and 22A are connected to the terminal electrodes 11 and 12 by a bonding material 30 at the parts above these bent parts 26A.

The present embodiment can also realize actions and effects similar to the first embodiment, but by having the body supports 25A and the bent parts 26A, further exhibits the following actions and effects.

That is, by providing pairs of body supports 25A at the external terminals 21 and 22 like in the present embodiment, positioning of the capacitor body 2 and the external terminals 21 and 22 becomes easy. Along with this, attachment of the external terminals 21 and 22 to the capacitor body 2 at the time of assembly of the multilayer capacitor 1 becomes easy. As a result, the cost of production of the multilayer capacitor 1 is also reduced.

Further, by providing the bent parts 26A at the base parts of the electrode connection parts 21A and 22A, the electrode connection parts 21A and 22A become longer without increasing the size of the multilayer capacitor 1 including the external terminals 21 and 22 more than necessary. The longer electrode connection parts 21A and 22A elastically deform more and can more reliably ease stress and vibration.

Third Embodiment

Figure 8:
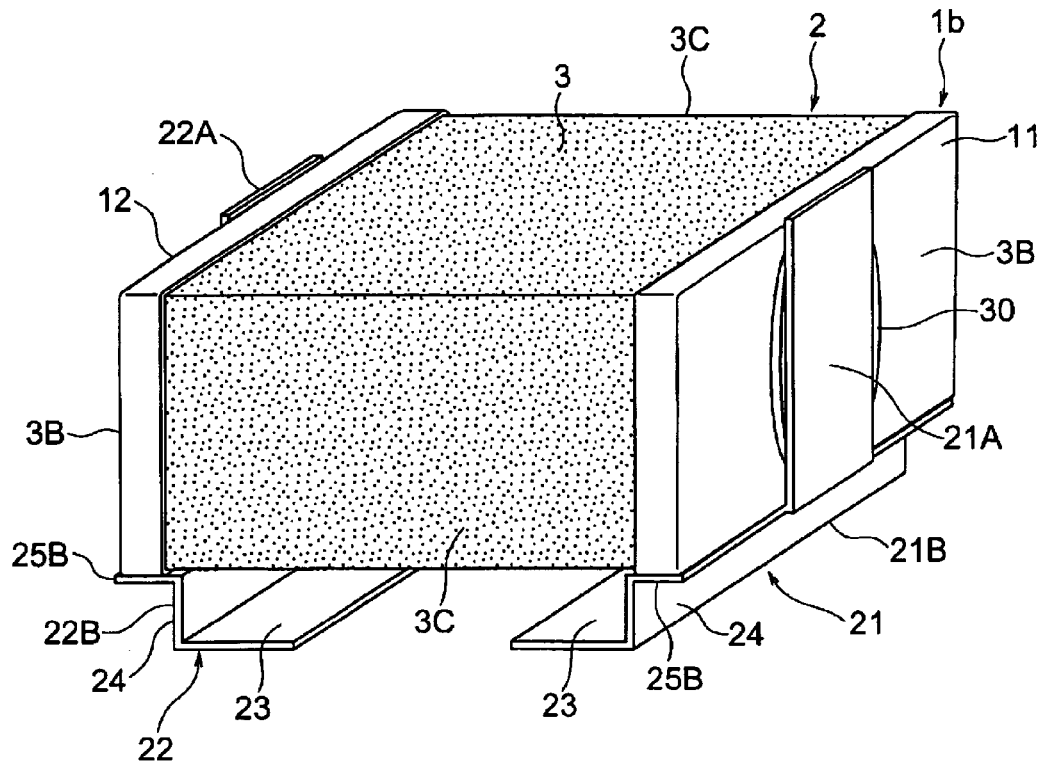
FIG. 8 is a perspective view of a multilayer capacitor according to a third embodiment of the present invention.
Figure 9:
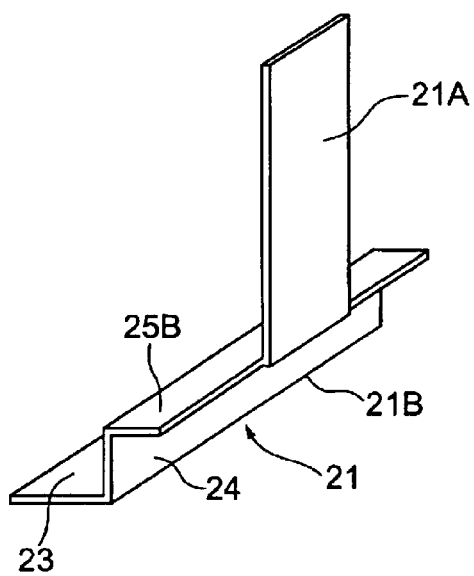
FIG. 9 is a perspective view of an external terminal used in the multilayer capacitor shown in FIG. 8.

Next, an electronic device according to a third embodiment of the present invention constituted by a multilayer capacitor will be shown in FIG. 8 and FIG. 9. Members the same as members explained in the first embodiment are assigned to same notations and overlapping explanations omitted.

This embodiment has substantially the same structure as the first embodiment and exhibits similar actions and effects. However, as shown in FIG. 8 and FIG. 9, in the present embodiment, the external connection parts 21B and 22B are bent into step-like shapes to form the body supports 25B. The widths of the body supports 25B are substantially the same as the widths of the external connection parts 21B and 22B. The bottom surfaces of the terminal electrodes 11 and 12 are placed on the body supports 25B.

That is, while differing in structure from the second embodiment, since body supports 25B are provided at the external terminals 21 and 22 in the present embodiment as well, in the same way as the second embodiment, positioning of the capacitor body 2 and the external terminals 21 and 22 becomes easy and the cost of production of the multilayer capacitor 1 is reduced.

Fourth Embodiment

Figure 10:
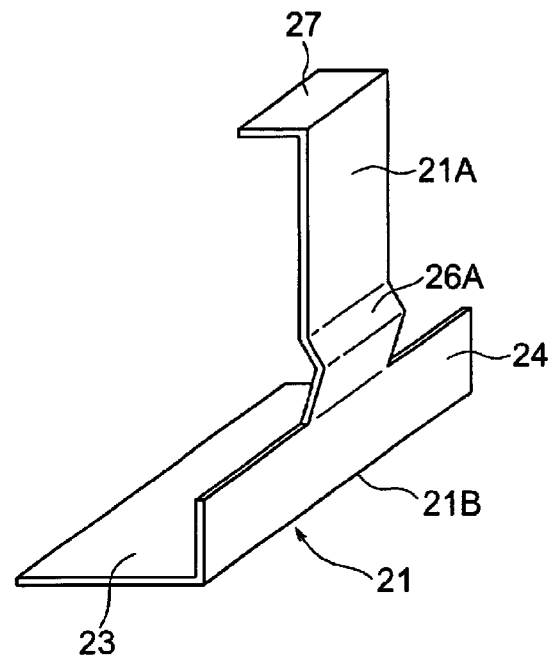
FIG. 10 is a perspective view of an external terminal used in a multilayer capacitor according to a fourth embodiment of the present invention.

Next, the external terminals of an electronic device according to a fourth embodiment of the present invention constituted by a multilayer capacitor are shown in FIG. 10. Members the same as members explained in the first embodiment are assigned the same notations and overlapping explanations are omitted.

This embodiment is structured substantially the same as the first embodiment and exhibits similar actions and effects. However, as shown in FIG. 10, in this embodiment, the base parts of the electrode connection parts 21A and 22A (in the figure, only the electrode connection part 21A shown) are provided with bent parts bent outward in triangular shapes in the same way as the second embodiment. The parts above the bent parts are structured to enable connection of the electrode connection parts 21A and 22A to the terminal electrodes 11 and 12 through a bonding material 30.

Further, the top ends of the electrode connection parts 21A and 22A are provided with guide pieces 27, for facilitating positioning with the capacitor body 2, formed bent at right angles toward the inside (capacitor body 2 side).

In this embodiment too, in the same way as the second embodiment, due to the presence of the bent parts 26C, the electrode connection parts 21A and 22A become longer and the stress and vibration can be eased more reliably.

Fifth Embodiment

Figure 11:
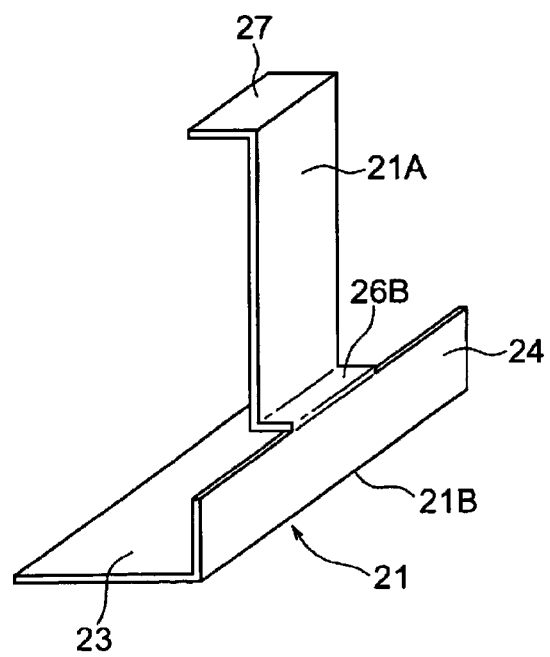
FIG. 11 is a perspective view of an external terminal used in a multilayer capacitor according to a fifth embodiment of the present invention.

Next, the external terminals of an electronic device according to a fifth embodiment of the present invention constituted by a multilayer capacitor are shown in FIG. 11. Members the same as members explained in the first embodiment are assigned the same notations and overlapping explanations are omitted.

This embodiment is structured substantially the same as the first embodiment and exhibits similar actions and effects. However, as shown in FIG. 11, in this embodiment, the base parts of the electrode connection parts 21A and 22A (in the figure, only the electrode connection part 21A shown) are provided with parts bent to right angles at two successive locations. These bent parts are designated as the bent parts 26B. Further, the parts above the bent parts 26B are structured to enable connection of the electrode connection parts 21A and 22A to the terminal electrodes 11 and 12 through a bonding material 30.

Further, the top ends of the electrode connection parts 21A and 22A are provided with guide pieces 27 similar to the fourth embodiment formed bent at right angles toward the capacitor body 2 side.

This embodiment, while differing somewhat in structure from the second embodiment, exhibits actions and effects similar to the second embodiment since bent parts 26B are provided at the base parts of the electrode connection parts 21A and 22A.

Sixth Embodiment

Figure 12:
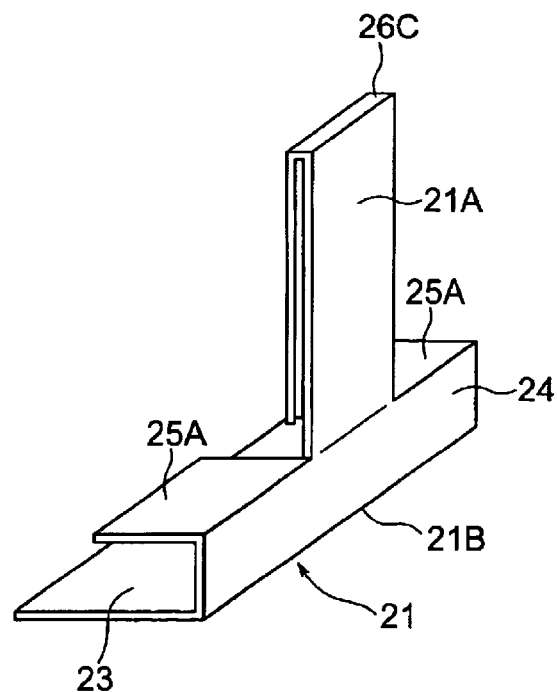
FIG. 12 is a perspective view of an external terminal used in a multilayer capacitor according to a sixth embodiment of the present invention.

Next, the external terminals of an electronic device according to a sixth embodiment of the present invention constituted by a multilayer capacitor are shown in FIG. 12. Members the same as members explained in the first embodiment are assigned the same notations and overlapping explanations are omitted.

This embodiment is structured substantially the same as the first embodiment and exhibits similar actions and effects. However, as shown in FIG. 12, in this embodiment, the external terminals 21 and 22 (in the figure, only the electrode connection part 21A being shown) are structured with the body supports 25A of the second embodiment. Further, in this embodiment, the electrode connection parts 21A and 22A extending upward once are bent at their top ends inward in U-shapes (to capacitor body 2 side).

In this embodiment, the bent parts 26C of the U-shaped bent back parts are provided. The electrode connection parts 21A and 22A are connected to the terminal electrodes 11 and 12 through a bonding material 30 at parts at the front end sides of these bent parts 26C.

In this embodiment, due to the presence of the substantially U-shaped bent parts 26C, the electrode connection parts 21A and 22A become longer without increasing the size of the multilayer capacitor 1 including the external terminals 21 and 22 more than necessary. Therefore, the stress and vibration can be eased more reliably.

Seventh Embodiment

Figure 13:
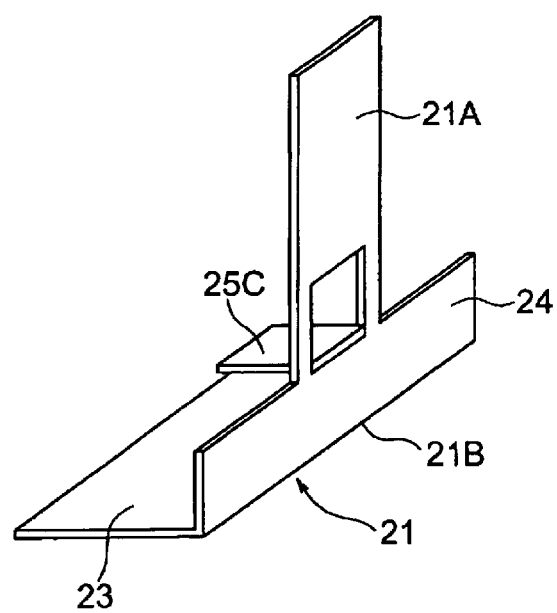
FIG. 13 is a perspective view of an external terminal used in a multilayer capacitor according to a seventh embodiment of the present invention.

Next, the external terminals of an electronic device according to a seventh embodiment of the present invention constituted by a multilayer capacitor are shown in FIG. 13. Members the same as members explained in the first embodiment are assigned the same notations and overlapping explanations are omitted.

This embodiment is structured substantially the same as the first embodiment and exhibits similar actions and effects. However, as shown in FIG. 13, in this embodiment, parts of the electrode connection parts 21A and 22A (in the figure, only the electrode connection part 21A being shown) are cut and bent inward to provide shelf-like body supports 25C.

In this embodiment, in the same way as the second embodiment, due to the body supports, attachment of the external terminals 21 and 22 to the capacitor body 2 at the time of assembly of the multilayer capacitor 1 becomes easy and the cost of production of the multilayer capacitor is reduced.

Eight Embodiment

Figure 14:
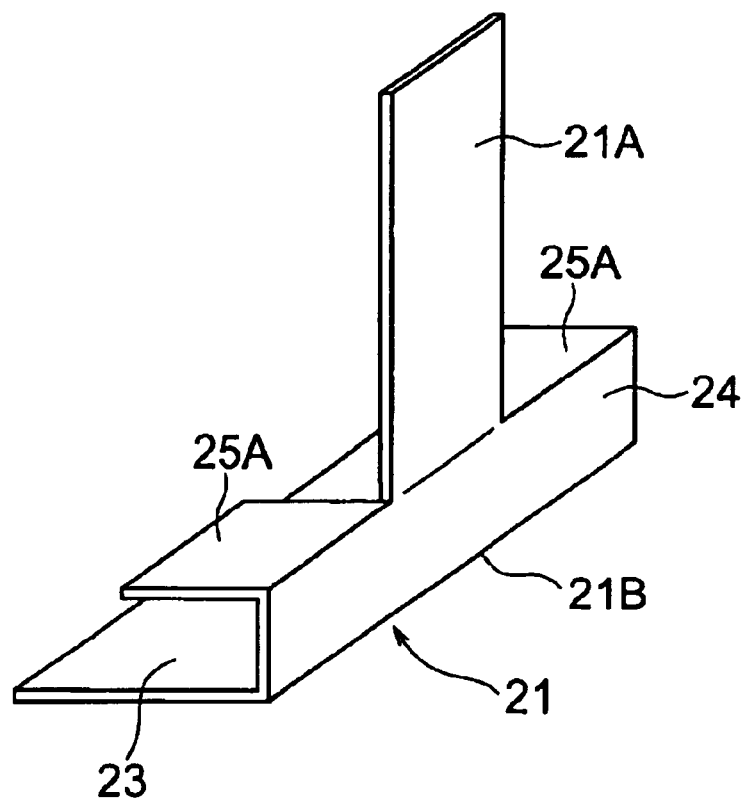
FIG. 14 is a perspective view of an external terminal used in a multilayer capacitor according to an eighth embodiment of the present invention.

Next, the external terminals of an electronic device according to an eighth embodiment of the present invention constituted by a multilayer capacitor are shown in FIG. 14. Members the same as members explained in the first embodiment are assigned the same notations and overlapping explanations are omitted.

This embodiment is structured substantially the same as the first embodiment and exhibits similar actions and effects. However, as shown in FIG. 14, in this embodiment, body supports 25A similar to the second embodiment are formed at the external terminals 21 and 22 (in the figure, only the electrode connection part 21A being shown).

Accordingly, this embodiment, in the same way as the second embodiment, attachment of the external terminals 21 and 22 to the capacitor body 2 at the time of assembly of the multilayer capacitor 1 becomes easy and the cost of production of the multilayer capacitor 1 is reduced.

EXAMPLE 1

Next, the amounts of vibration of a test board when mounting different samples were measured using a laser doppler vibrometer to find the vibration characteristics of the samples causing noise.

Figure 15:
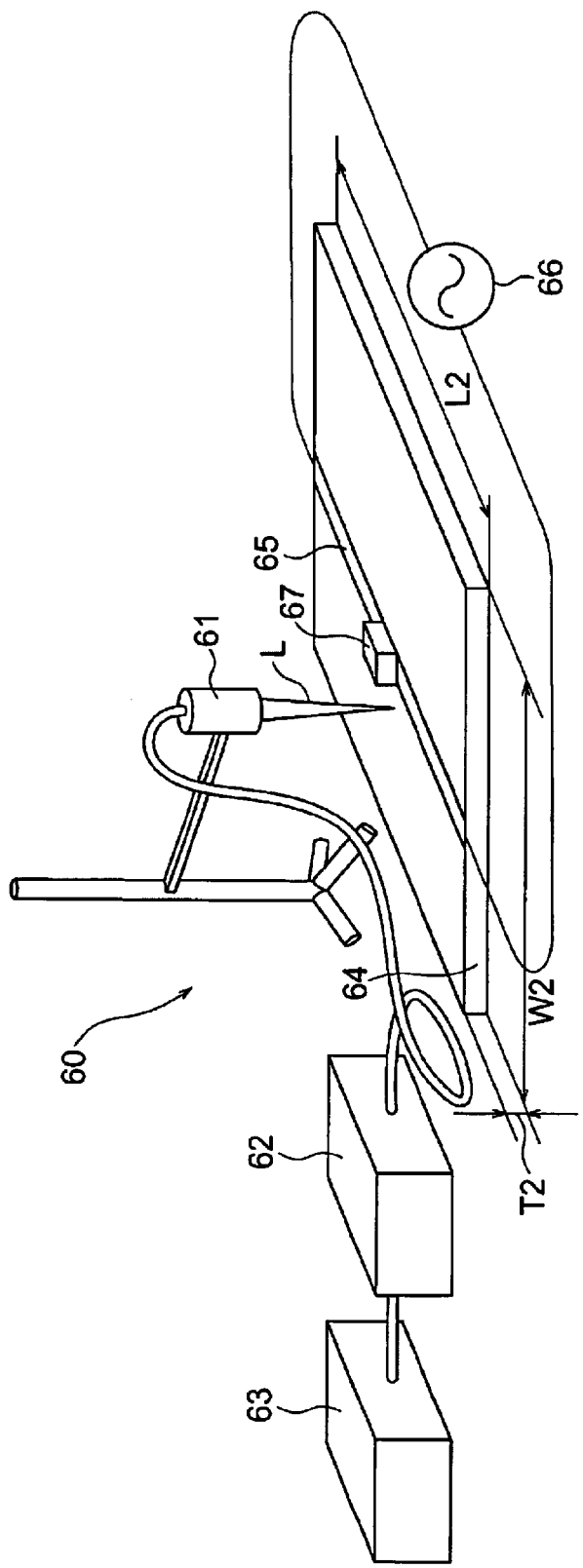
FIG. 15 is an explanatory view of the state of measurement of samples.

A laser doppler vibrometer 60 specifically, as shown in FIG. 15, is comprised of a sensor 61 for emitting an infrared laser beam L and detecting the reflected infrared laser beam L, an O/E unit 62 for converting the infrared laser beam L to an electrical signal, and an oscilloscope 63 for displaying the electrical signal converted by the O/E unit 62.

An infrared laser beam L is emitted from the sensor 61 of the laser doppler vibrometer 60 onto the test board 64 about 1 mm away from the sample. Using this, the vibration transmitted from the stack of the sample to the test board 64 is detected by the sensor 60.

Next, the samples will be explained in further detail. That is, a multilayer ceramic capacitor having conventional external terminals was used as Comparative Example 1, while a multilayer capacitor 1 according to the first embodiment comprising a capacitor body 2 shown in FIG. 1 of the same structure besides the terminal electrodes and provided with the pair of external terminals 21 and 22 was used as Example 1.

As the dimensions of the samples used here, the distance between the side faces having the pairs of terminal electrodes was designated as the dimension L1, the distance between side faces perpendicular to these side faces as the dimension W, and the thickness as the dimension T. At this time, in both the comparative example and the example of the inventions, L1=3.2 mm, W=2.5 mm, and T=2.5 mm.

On the other hand, the external dimensions of the test board 64 used for the test and shown in FIG. 15 were L2=100 mm, W2=40 mm, and T2=1.6 mm. The test board 64 was mainly made from a glass epoxy-based resin and had a thickness of copper foil forming the interconnect patters 65 of 35 $\mu$m. Further, the voltage supplied to the sample from a power source 66 connected to the sample 67 on the test board 64 shown in FIG. 15 was made a DC voltage of 19V and also an AC voltage of 1.0 Vrms as a sine wave of 5 kHz.

Figure 16A:
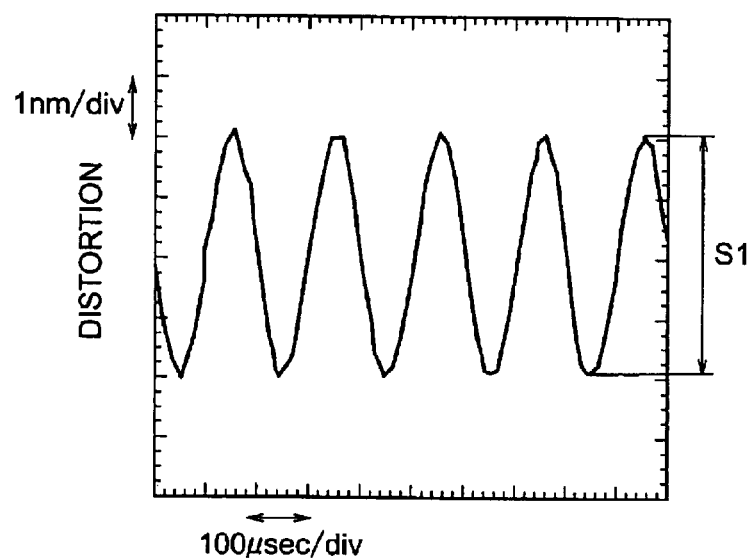
FIG. 16A is a view showing the waveform of an oscilloscope and shows a waveform of vibration of a test board of a comparative example.
Figure 16B:
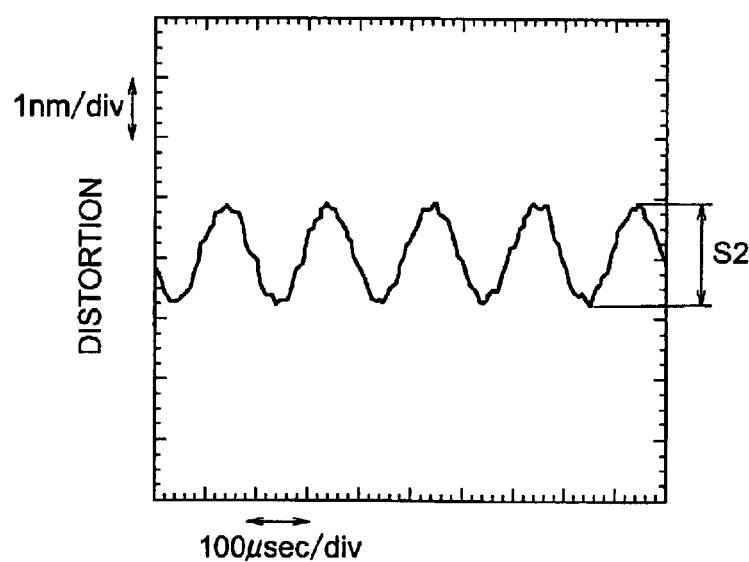
FIG. 16B is a view of a waveform of vibration of a test board of an example of the invention.

In the results of the test, from the waveform of the oscilloscope, in Comparative Example 1, the strain S1 constituting the maximum vibration of the test board 64 shown in FIG. 16A was about 4.1 nm, while in Example 1, the strain S2 constituting the maximum vibration of the test board 64 shown in FIG. 16B was about 1.6 nm.

That is, in Example 1, compared with Comparative Example 1, it was confirmed from the results of the measurement that the amount of vibration of the board was greatly reduced and the noise became smaller. Here, the nominal electrostatic capacities of the comparative example and example of the invention in the case of capacitors were 10 $\mu$F, but in actuality, the electrostatic capacity of the comparative example was 10.05 $\mu$F and the electrostatic capacity of the example of the invention was 10.12 $\mu$F.

Figure 17:
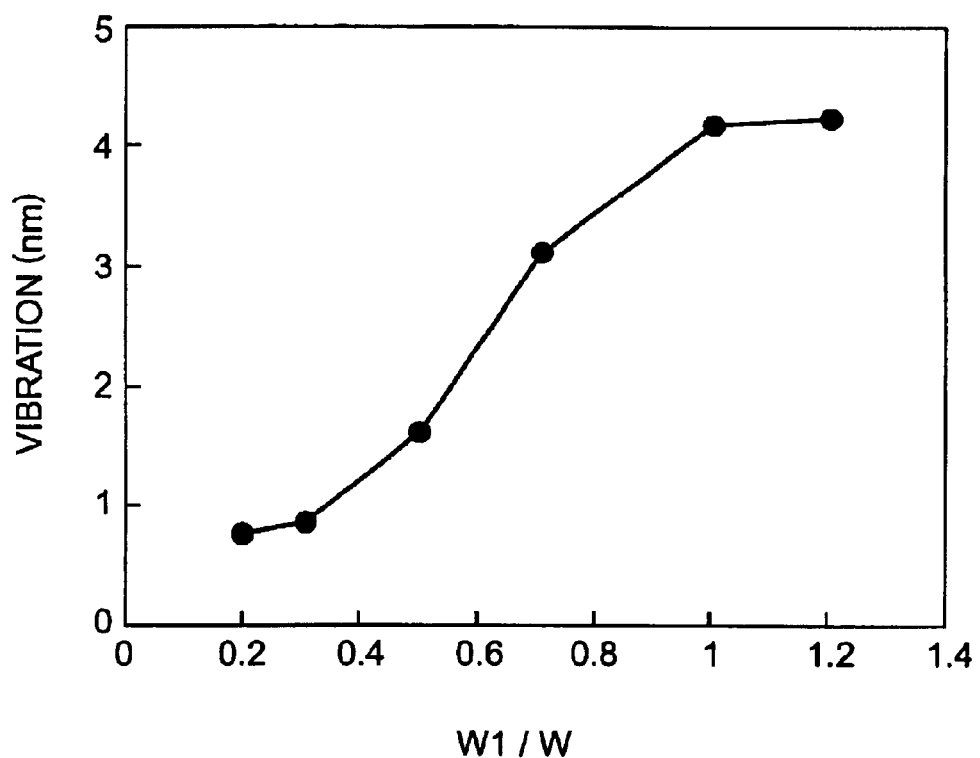
FIG. 17 is a graph for explaining the relationship between a ratio of dimensions and the amount of vibration.

On the other hand, the relationship between the ratio of the width dimensions W of the terminal electrodes 11 and 12 and the width dimensions W1 of the electrode connection parts 21A and 22A of the external terminals 21 and 22 and the amount of vibration as constituted by the maximum amount of vibration is shown in the graph of FIG. 17. From this graph, it can be understood that when the ratio is not more than 0.5, there is the effect that the amount of vibration becomes not more than 2 nm. Further, it can be understood that when the ratio is not more than 0.4, the effect is even greater. However, considering the bonding strength between the terminal electrodes 11 and 12 and the external electrodes 21 and 22, it is preferable that the ratio of dimensions be made the range of 0.3 to 0.5.

Figure 18A:
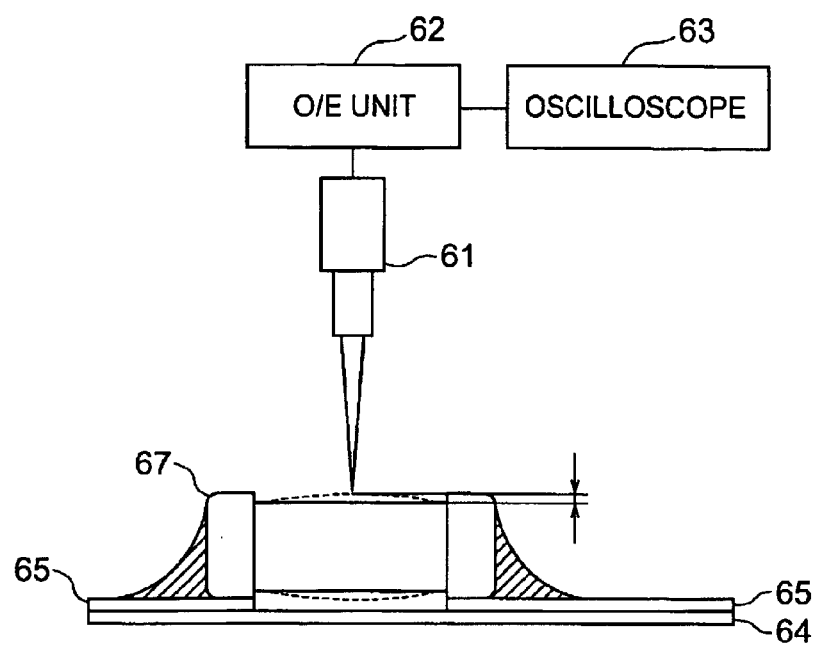
FIG. 18A is a view for explaining measurement of the amounts of vibration of examples and comparative examples and explains measurement of the amount of vibration of a main body.
Figure 18B:
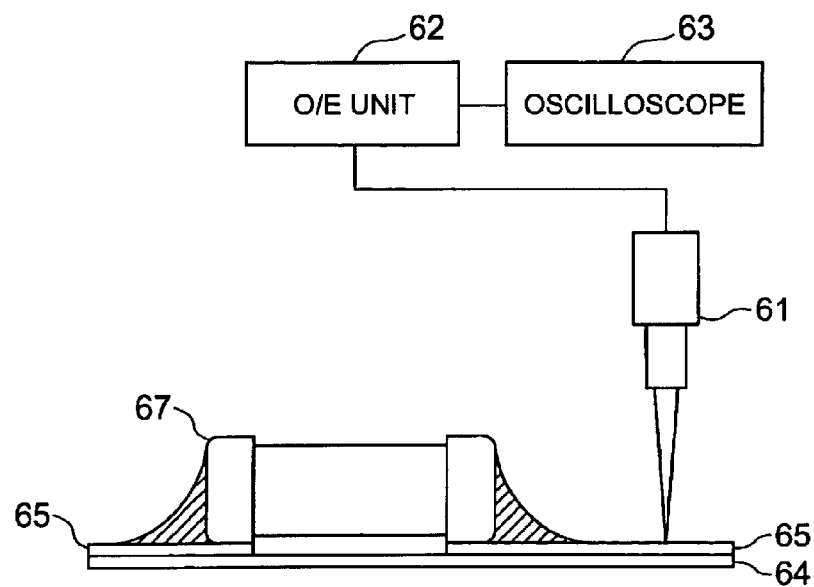
FIG. 18B is a view for explaining measurement of the amount of vibration of a board.

Further, four other samples of examples of the invention with different dimensions were prepared. Similarly, four other samples of comparative examples with different dimensions were prepared. The results of testing these will be explained next. That is, in the same way as above, a laser doppler vibrometer was used to measure the amounts of vibration of the bodies as shown in FIG. 18A and measure the amount of vibration of the board as shown in FIG. 18B. The generation of noise was evaluated separately.

At this time, the dimensions of the samples were as shown in Table 1. The value of the ratio W/T between the width dimension W of the capacitor body 2 and the height dimension T of the capacitor body 2 was made one within the range of 0.8 to 1.2 for each sample. The value of the ratio D/L1 between the length dimension L1 of the multilayer capacitor 1 as a whole and the separation distance D between the external connection parts 21B and 22B and the facing capacitor body 2, however, was made a range of 0.02 to 0.600 for the four samples of the examples of the invention and made outside this range for the four samples of the comparative examples. Further, the internal conductor layers 4 and 5 and the abutting parts 23 of the external connection parts 21B and 22B were arranged to become parallel to each other. Further, Comparative Example 2 was a sample with no external electrodes, so the value of the ratio D/L1 was not measured.

TABLE 1

|  | Orientation of internal conduc-tors | W/T ratio | D/L1 ratio | Amount of vibration of body (nm) | Amount of vibration of board (nm) | Generation of sound |
| --- | --- | --- | --- | --- | --- | --- |
| Comp. Ex. 2 | Parallel | 0.8 to 1.2 | — | 34.5 | 6.5 | Yes |

TABLE 1-continued

|  | Orientation of internal conduc-tors | W/T ratio | D/L1 ratio | Amount of vibration of body (nm) | Amount of vibration of board (nm) | Gen-eration of sound |
|---|---|---|---|---|---|---|
| Comp. Ex. 3 | Parallel | 0.8 to 1.2 | 0.025 to 0.020 | 20.4 | 6.8 | Yes |
| Ex. 2 | Parallel | 0.8 to 1.2 | 0.025 to 0.030 | 29.5 | 1.0 | No |
| Ex. 3 | Parallel | 0.8 to 1.2 | 0.070 to 0.100 | 27.1 | 0.6 | No |
| Ex. 4 | Parallel | 0.8 to 1.2 | 0.180 to 0.220 | 33.1 | 1.0 | No |
| Ex. 5 | Parallel | 0.8 to 1.2 | 0.550 to 0.700 | 30.1 | 0.7 | No |
| Comp. Ex. 4 | Parallel | 0.8 to 1.2 | 0.630 to 0.700 | 31.2 | 1.7 | Yes |
| Comp. Ex. 5 | Parallel | 0.8 to 1.2 | 0.800 to 0.900 | 29.8 | 1.6 | Yes |

From Table 1, the amounts of vibration of the board were smaller in Examples 2 to 5 compared with Comparative Examples 2 to 5. Further, Examples 2 to 5 had no generation of noise. The results were therefore excellent. Accordingly, it can be understood that by making the value of the ratio D/L1 in the range of 0.025 to 0.600, the size of the separation distance D with respect to the length L1 of the multilayer capacitor 1 as a whole becomes suitable.

That is, if the separation distance D between the external connection parts 21B and 22B and the facing surfaces of the capacitor body 2 is too large with respect to the length L1 of the multilayer capacitor 1 as a whole, the amplitude of the vibration is liable to conversely be enlarged at the electrode connection parts 21A and 22A. Further, if too small, the function of reducing the amplitude of the vibration at the electrode connection parts 21A and 22A is liable not to sufficiently work.

As explained above, according to the present invention, it becomes possible to provide an electronic device suppressing propagation of vibration caused due to piezoelectric and electrostriction phenomena and reducing the generation of noise.

Ninth Embodiment

Figure 20:
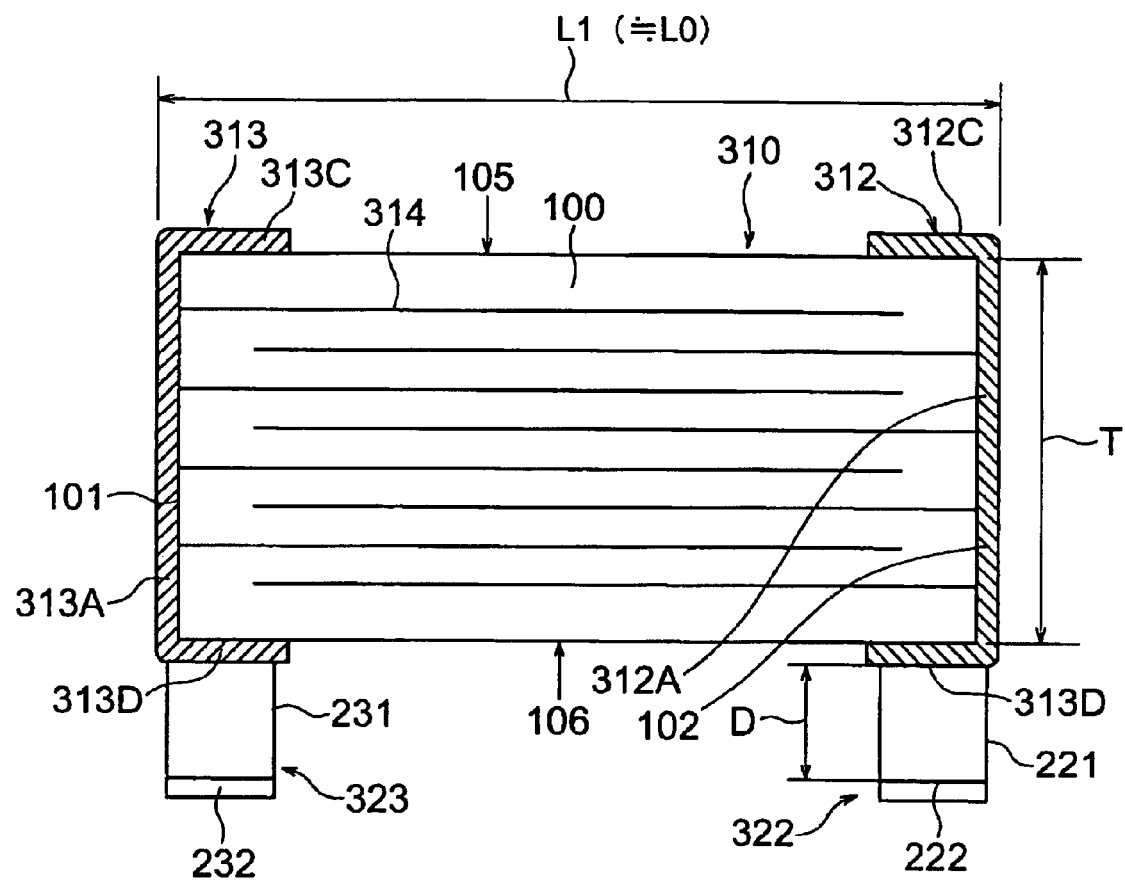
FIG. 20 is a cross-sectional view along the line XX—XX in FIG. 19.

As shown in FIG. 19 and FIG. 20, the ceramic capacitor of the ninth embodiment includes a ceramic capacitor body 310 and a pair of external terminals 322 and 323. The ceramic capacitor body 310 has a length dimension L1, a thickness dimension (height dimension) T, and a width dimension W as external dimensions and has a dielectric body (main body) 100, a terminal electrode 312 and 313, and a plurality of internal electrodes 314. The ceramic capacitor is comprised of the single ceramic capacitor body 310, but this is only an example. Two or more ceramic capacitor bodies 310 can also be used in combination. Note that the length L1 of the body 310 is substantially equal to the length L0 of the body 100.

The dielectric body 100 is comprised of a ceramic dielectric. The terminal electrodes 312 and 313 are provided at the two sides of the dielectric body 100 in the length direction X.

As shown in FIG. 20, the dielectric body 100 of the body 310 includes ceramic layers and internal conductor layers 314. The internal conductor layers 314 are alternately stacked in the stacking direction Z (also called "height direction") via ceramic layers. The number of the internal conductor layers 314 stacked is not particularly limited, but is for example about 100.

The centers of these internal conductor layers 314 are arranged to be at substantially the same positions as the centers of the ceramic layers. Further, the length and width dimensions of the internal conductor layers 314 are made smaller than the lengths of the corresponding sides of the ceramic layers.

The internal conductor layers 314 have leadout parts. The widths of these leadout parts are substantially the same as the widths of the internal conductor layers 314. The leadout parts of one group of the internal conductor layers 314 are connected to a terminal electrode 312 formed at one end face 102 of the dielectric body 100 in the longitudinal direction X. The leadout parts of the other group of internal conductor layers 314 are connected to a terminal electrode 313 formed at the other end face 101 of the dielectric body 100 in the longitudinal direction X.

As the material of the internal conductor layers 314, not only base metals such as nickel, nickel alloys, copper, and copper alloys, but also materials mainly comprised of these metals may be considered.

The terminal electrodes 312 and 313 have electrode end faces 312A and 313A positioned at the end faces 102 and 101 of the dielectric body 100 in the longitudinal direction and electrode side faces 312B and 313B formed at the side faces of the body 100 in the width direction Y so as to be connected to the electrode end faces. The terminal electrodes 312 and 313 have electrode top surfaces 312C and 313C formed at the top surface of the body 100 so as to be connected to the electrode end faces and electrode bottom surfaces 312D and 313D formed at the bottom surface of the body 100 so as to be connected to the electrode end faces.

The widths L2 of the electrode side faces 312B and 313B, the electrode top surfaces 312C and 313C, and the electrode bottom surfaces 312D and 313D are substantially the same in this embodiment and are sizes of 5% to 20% with respect to the length (L0) of the body 100.

The materials, methods of production, etc. of the dielectric body 100, terminal electrodes 312 and 313, and internal electrodes 314 are known. In a typical example, the dielectric body 100 of the ceramic capacitor body 310 is mainly comprised of barium titanate ($BaTiO_3$), the internal electrodes 314 are mainly comprised of nickel (Ni), and the terminal electrodes 312 and 313 are comprised by electrodes of copper paste containing glass frit baked onto the two facing ends of the dielectric body 100.

The ceramic capacitor has a pair of external electrodes 322 and 323. The external electrodes 322 and 323 are comprised of metal sheet members and have electrode connection parts 221 and 231 and external connection parts 222 and 232. The electrode connection parts 221 and 231 are connected to electrode side faces 312B and 313B of the terminal electrodes 312 and 313 at the same side face 104 of the dielectric body 100 in the width direction. The external connection parts 222 and 232 are bent so as to be separated from the bottom surface 106 of the dielectric body 100 by the separation distance D. The widths of the external terminals 322 and 323 are equal to or smaller than the widths L2 of the electrode side faces.

The electrode connection part 221 of the external electrode 322 and the terminal electrode 312 are bonded together via a known bonding material. Similarly, the electrode connection part 231 of the external electrode 323 and the terminal electrode 313 are bonded together via a known bonding material. The bonding material is preferably comprised of a solder ingredient and a flux ingredient. The bonding material is easily coated on the terminal electrodes 312 and 313 of the ceramic capacitor body 310 by a means such as printing, dispenser coating, spraying, or brushing.

In this embodiment, in the ceramic capacitor 310, vibration unavoidably occurring due to an electrostriction phenomenon is prevented from being transmitted to the board by the mounting structure of the external terminals 322 and 323.

In the sample shown in FIG. 19 and FIG. 20, the external terminals 322 and 323 are comprised of metal members and have electrode connection parts 221 and 231 and external connection parts 222 and 232. The electrode connection parts 221 and 231 are connected to the electrode side faces 312B and 313B of the terminal electrodes 312 and 313 at one side face 104 of the dielectric body 100 in the width direction. The external connection parts 222 and 232 are bent at the bottom end sides of the electrode connection parts 221 and 231 so as to be separated from the bottom surface 106 of the dielectric body 100 by a separation distance D.

If adopting the above mounting structure, the generation of noise is suppressed. This is believed to be because the electrostriction phenomenon of the ceramic capacitor is suppressed by the mounting positions and structures of the external terminals 322 and 323 and the vibration due to the electrostriction phenomenon which would otherwise be transmitted to the board is absorbed by the springiness of the external terminals 322 and 323.

Figure 21:
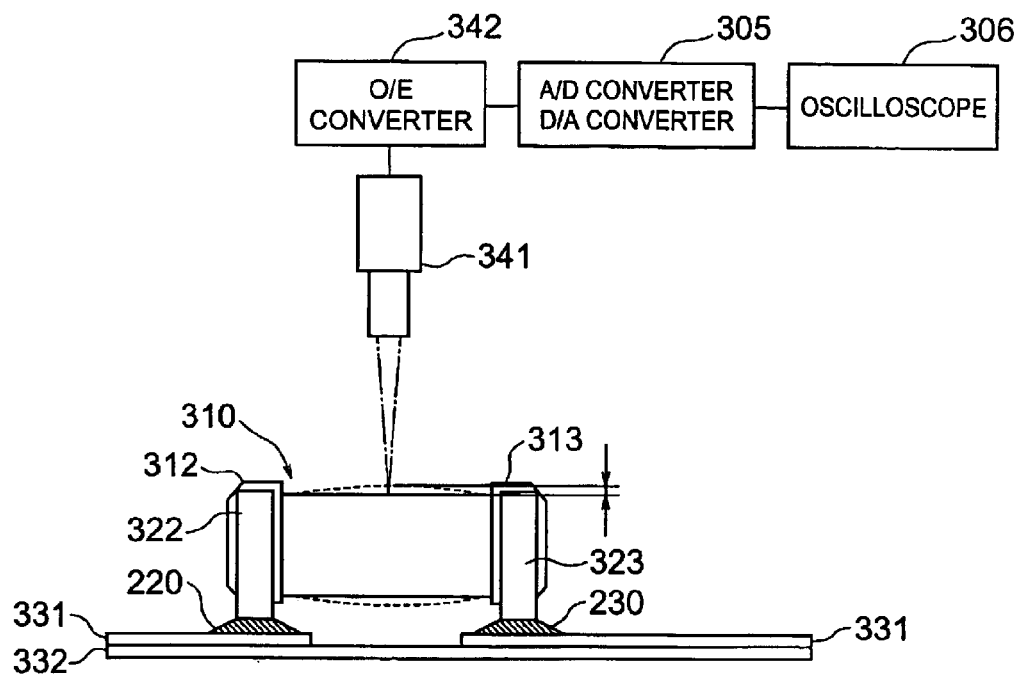
FIG. 21 is a view of a method of inspection of characteristics of a ceramic capacitor.
Figure 22:
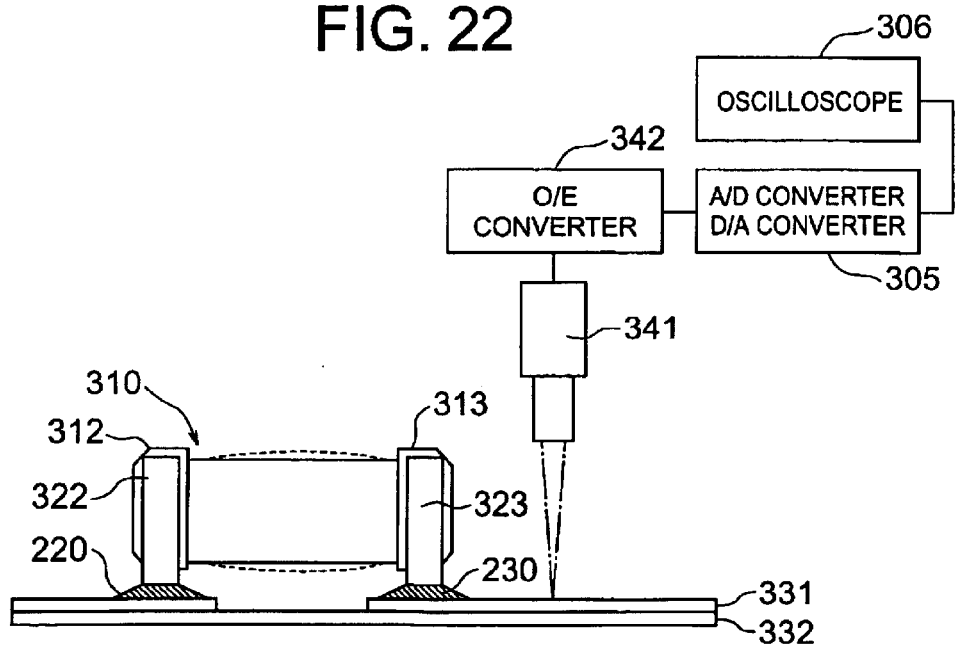
FIG. 22 is a view of a method of inspection of characteristics of a ceramic capacitor.

FIG. 21 and FIG. 22 show the method of measurement of the characteristics of ceramic capacitors. FIG. 21 shows the method of measurement of the amount of vibration of the body, while FIG. 22 shows the method of measurement of the amount of vibration of the board. In the method of measurement shown in FIG. 21 and FIG. 22, the ceramic capacitor body 310 is placed on conductor patterns 331 and a circuit board 332. The conductor patterns 331 are provided on the circuit board 332. The ceramic capacitor body 310 is fixed to and electrically connected with the conductor patterns 331 by the bonding materials 220 and 230.

The measurement system shown in FIG. 21 and FIG. 22 includes a photo sensor 341, an opto-electric converter 342, an analog/digital converter 356, and a vibration measuring apparatus 336. The vibration measuring apparatus 306 is typically an oscilloscope.

Next, the results of measurement by the above method of measurement of characteristics of ceramic capacitors will be explained with reference to Table 2.

TABLE 2

| | W/T | d/L | Amount of vibration of body (nm) | Amount of vibration of board (nm) | Generation of noise |
|---|---|---|---|---|---|
| Sample 1 | 0.8 to 1.2 | 0.010 to 0.020 | 30.1 | 1.9 | Yes |
| Sample 2 | 0.8 to 1.2 | 0.025 to 0.030 | 29.5 | 1.0 | No |
| Sample 3 | 0.8 to 1.2 | 0.070 to 0.100 | 27.1 | 0.6 | No |
| Sample 4 | 0.8 to 1.2 | 0.018 to 0.220 | 33.1 | 1.0 | No |
| Sample 5 | 0.8 to 1.2 | 0.550 to 0.600 | 30.1 | 0.7 | No |
| Sample 6 | 0.8 to 1.2 | 0.630 to 0.700 | 31.2 | 1.7 | Yes |
| Sample 7 | 0.8 to 1.2 | 0.800 to 0.900 | 29.8 | 1.6 | Yes |

TABLE 2-continued

In Table 2, the W/T ratio shows the ratio of the width dimension W and height dimension T of the ceramic capacitor body 310. In the experiments, the W/T ratio was set to be in the range of 0.8 to 1.2.

The D/L1 ratio shows the ratio of the separation distance D between the bottom surface 106 of the dielectric board 100 and the mounting surface 200 and the length dimension L1 of the ceramic capacitor. Normally, the length dimension L1 of the ceramic capacitor is constant, so any change in the D/L ratio shows a change in the separation distance D.

The "amount of vibration of body" shows the amount of vibration occurring at the surface of the ceramic capacitor body 310 due to the electrostriction phenomenon, while the "amount of vibration of board" shows the amount of vibration detected at the surface of the board. The "generation of noise" shows the existence of buzzing noise as confirmed by human hearing. Such buzzing noise is considered a universal measurement result which can be sensed even by general ordinary persons.

In Table 2, Sample 1 has external terminals 322 and 323 connected to the two end faces 101 and 102 of the dielectric body 100 in the length direction (comparative example). The external terminals 322 and 323 of Sample 1 have the structures shown in FIG. 19 and FIG. 20 and differ only in mounting positions. Samples 2 to 7 are ceramic capacitors of the structures of FIG. 19 and FIG. 20 and differ in the D/L ratio.

As will be clear from Table 2, in the case of Sample 1 having external terminals 322 and 323 connected to the two end faces 101 and 102 of the dielectric body 100 in the length direction, the amount of vibration of the board was a high value of 1.9 nm. Generation of noise was confirmed.

As opposed to this, in the case of each of Samples 2 to 5 with electrode connection parts 221 and 231 connected to the terminal electrodes 312 and 313 at the side face 104 of the dielectric body 100 in the width direction, the amount of vibration of the board was a low value in the range of 0.6 nm to 1.0 nm. Generation of noise was not confirmed.

What range to set the D/L ratio in is important from the viewpoint of the prevention of generation of noise. If viewing the data of Table 2, when setting the W/T ratio in the range of 0.8 to 1.2, the generation of noise can be prevented if setting the D/L ratio in the range of 0.025 to 0.600. If the D/L ratio exceeds 0.600, noise is generated as shown in Samples 6 and 7. Further, if the D/L ratio becomes smaller than 0.02, as suggested by Sample 1, noise is generated. From the above viewpoint, the preferable range of the D/L ratio in a ceramic capacitor is 0.025 to 0.600.

Other Embodiments

Next, other embodiments will be explained with reference to FIG. 23 to FIG. 30. In the figures, components the same as the components shown in FIG. 19 and FIG. 20 are assigned the same reference notations and overlapping explanations are omitted.

Figure 23:
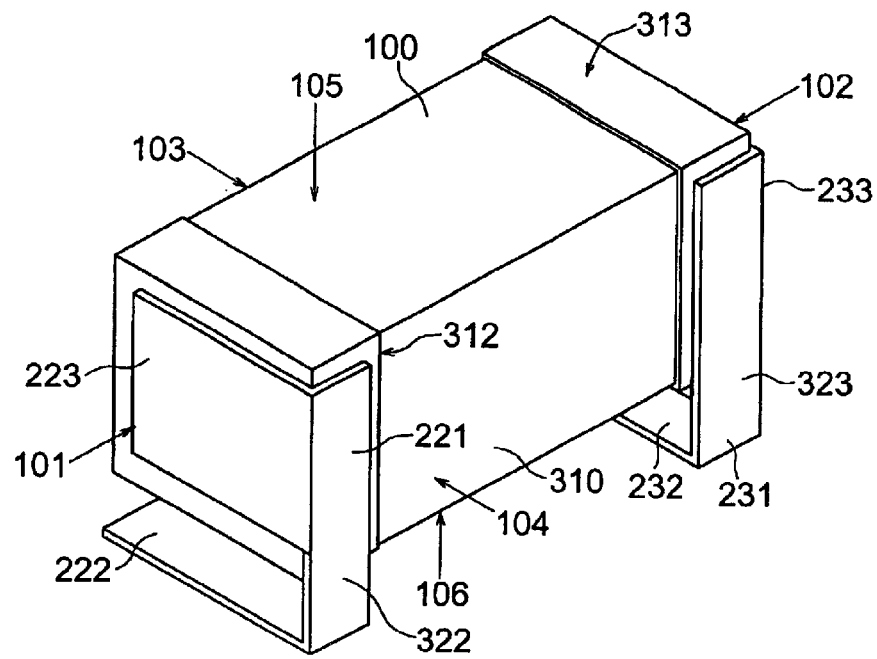
FIG. 23 is a perspective view of a ceramic capacitor according to another embodiment of the present invention.

First, in the embodiment shown in FIG. 23, external terminals 322 and 323 have not only electrode connection parts 221 and 231 to be connected to terminal electrodes 312 and 313 at one same side face 104 of the dielectric body 100 in the width direction, but also end face connection pieces 223 and 233 to be connected to the terminal electrodes 312 and 313 at the two end faces 101 and 102 of the dielectric body 100 in the length direction. This embodiment also exhibits actions and effects similar to the embodiment shown in FIG. 19 and FIG. 20.

Figure 24:
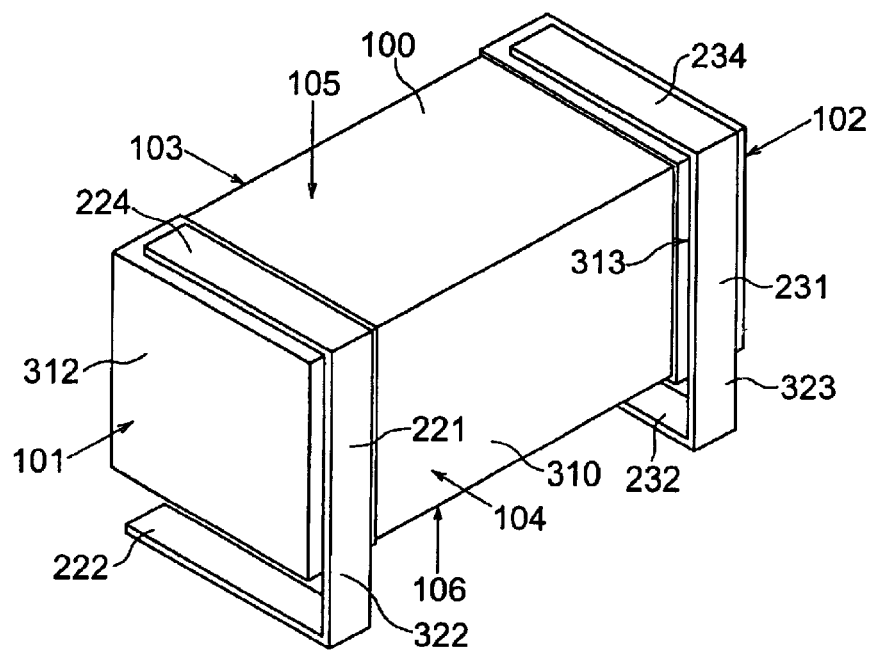
FIG. 24 to FIG. 30 are perspective views of ceramic capacitors according to further embodiments of the present invention.

In the embodiment shown in FIG. 24, external terminals 322 and 323 have not only electrode connection parts 221 and 231 to be connected to terminal electrodes 312 and 313 at one same side face 104 of the dielectric body 100 in the width direction, but also top surface connection pieces 224 and 234 to be connected to the terminal electrodes 312 and 313 at the top surface 103 of the dielectric body 100 in the thickness direction. This embodiment also exhibits actions and effects similar to the embodiment shown in FIG. 19 and FIG. 20.

Figure 25:
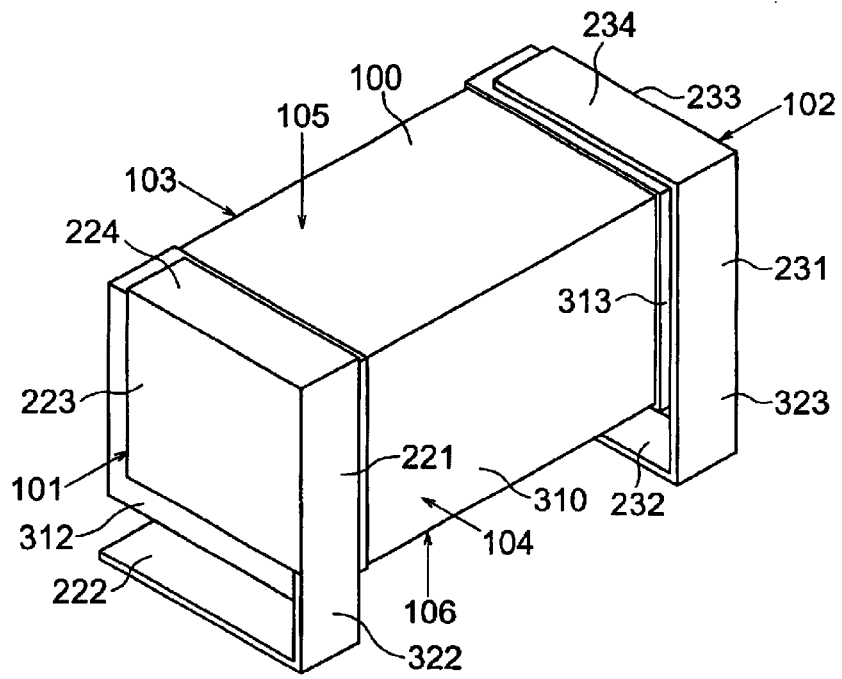

In the embodiment shown in FIG. 25, external terminals 322 and 323 have electrode connection parts 221 and 231 to be connected to terminal electrodes 312 and 313 at one same side face 104 of the dielectric body 100 in the width direction. Further, the external terminals have end face connection pieces 223 and 233 to be connected to the terminal electrodes 312 and 313 at the two end faces 101 and 102 of the dielectric body 100 in the length direction. Further, the external terminals have top surface connection pieces 224 and 234 to be connected to the terminal electrodes 312 and 313 at the top surface 103 of the dielectric body 100 in the thickness direction. This embodiment also exhibits actions and effects similar to the embodiment shown in FIG. 19 and FIG. 20.

Figure 26:
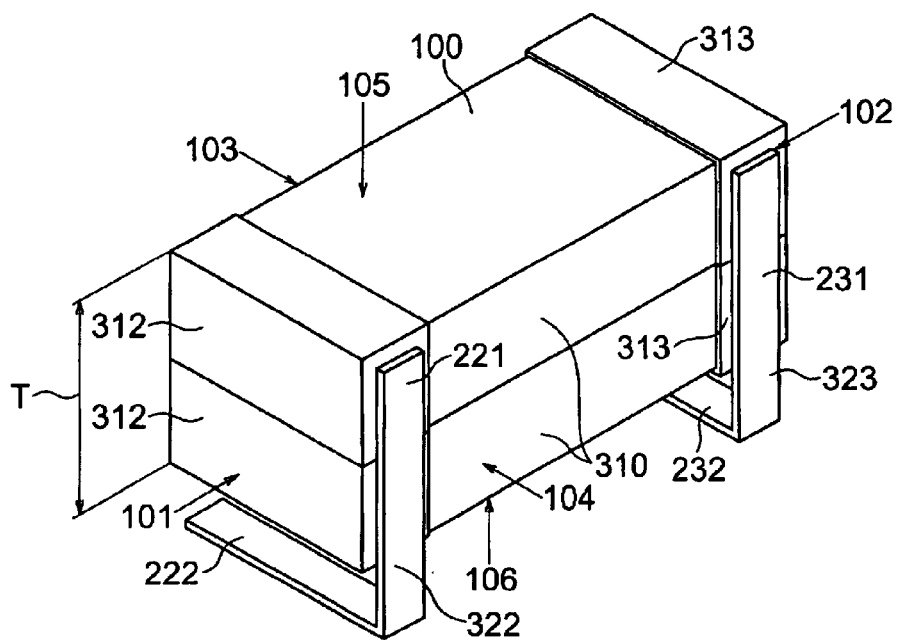

The embodiment shown in FIG. 26 covers the case of inclusion of a plurality of ceramic capacitors 310. The figure shows two ceramic capacitors 310, but it is clear that more may also be included. The ceramic capacitors 310 are stacked in the thickness direction (stacking direction Z) and the terminal electrodes 312—312 and 313—313 are bonded together by solder etc.

In the case of the embodiment shown in FIG. 26, the thickness dimension T shown in Table 2 is the thickness dimension T of n times the thickness of a single ceramic capacitor 10 in the case of n number of ceramic capacitors 10. The electrode connection parts 221 and 231 are commonly connected to the terminal electrodes 312 and 313 of the two ceramic capacitors 310, 310.

Figure 27:
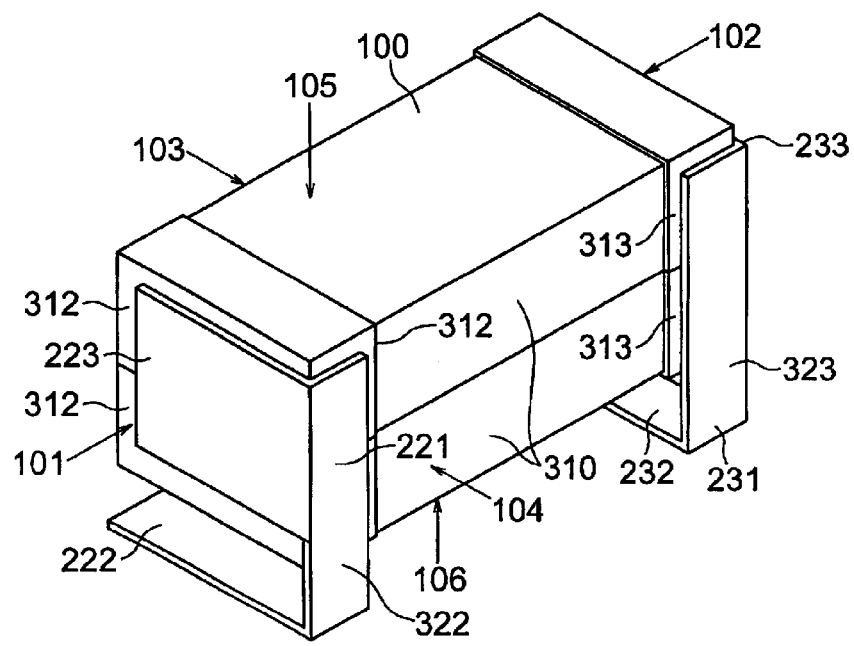

In the embodiment shown in FIG. 27, external terminals 322 and 323 have not only electrode connection parts 221 and 231 to be connected to terminal electrodes 312 and 313 of ceramic capacitors 310, 310, but also end face connection pieces 223 and 233 to be connected to the terminal electrodes 312 and 313 at the end faces 101 and 102 of the dielectric bodies 100 in the length direction.

Figure 28:
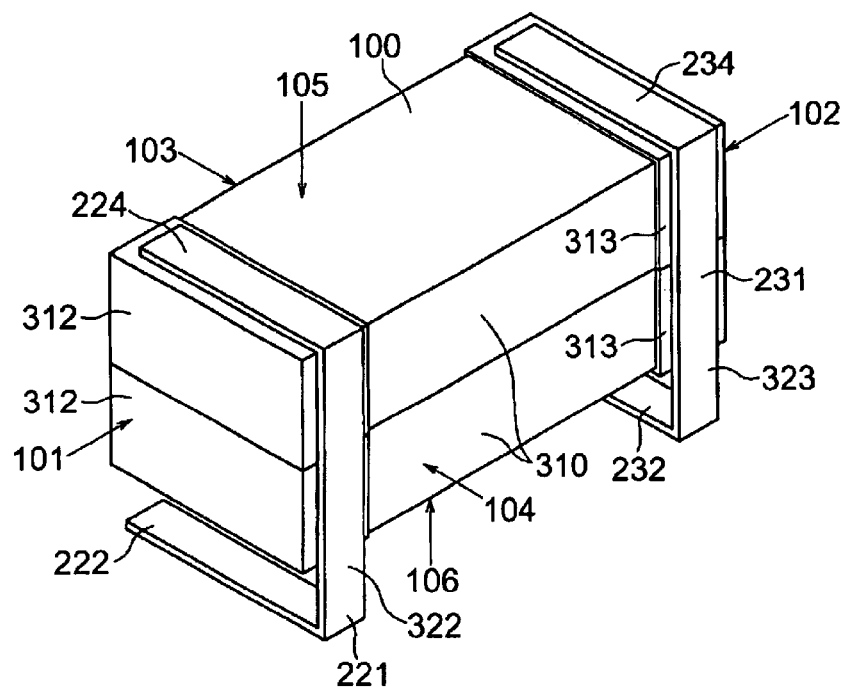

In the embodiment shown in FIG. 28, external terminals 322 and 323 have not only electrode connection parts 221 and 231 to be connected to terminal electrodes 312 and 313 at side faces 104 of the dielectric bodies 100 in the width direction, but also top surface connection pieces 224 and 234 to be connected to the terminal electrodes 312 and 313 at the top surface 103 of the dielectric body 100 of the ceramic capacitor 310 positioned at the top.

Figure 29:
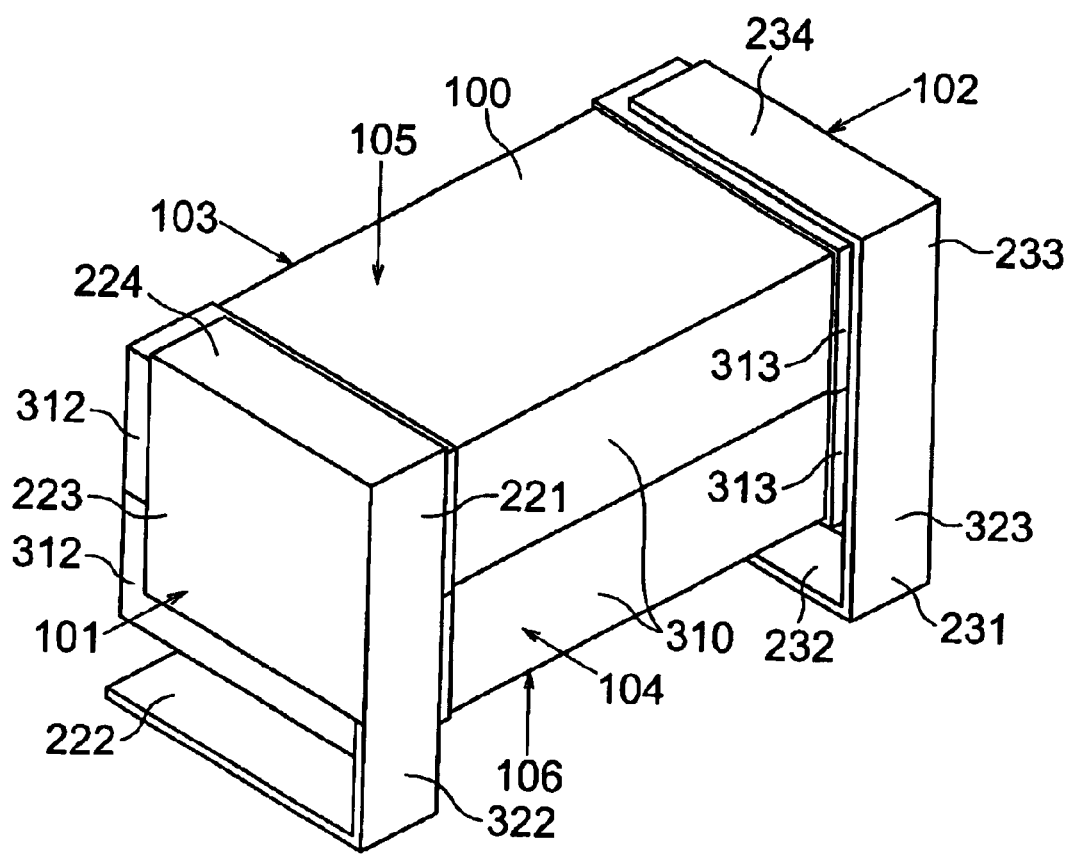

In the embodiment shown in FIG. 29, external terminals 322 and 323 have electrode connection parts 221 and 231 to be commonly connected to terminal electrodes 312 and 312 of two ceramic capacitors 310 and 310 at the side faces 104 of the dielectric bodies 100 in the width direction. Further, the external terminals 322 and 323 have end face connection pieces 223 and 233 to be commonly connected to terminal electrodes 312 and 313 of the two ceramic capacitors 310 and 310 at the end faces 101 and 102 of the dielectric body 100 in the length direction. Further, the external terminals 322 and 323 have top surface connection pieces 223 and 234 connected to terminal electrodes 312 and 313 at the top surface of the ceramic capacitor 310 positioned at the top layer in the thickness direction.

Figure 30:
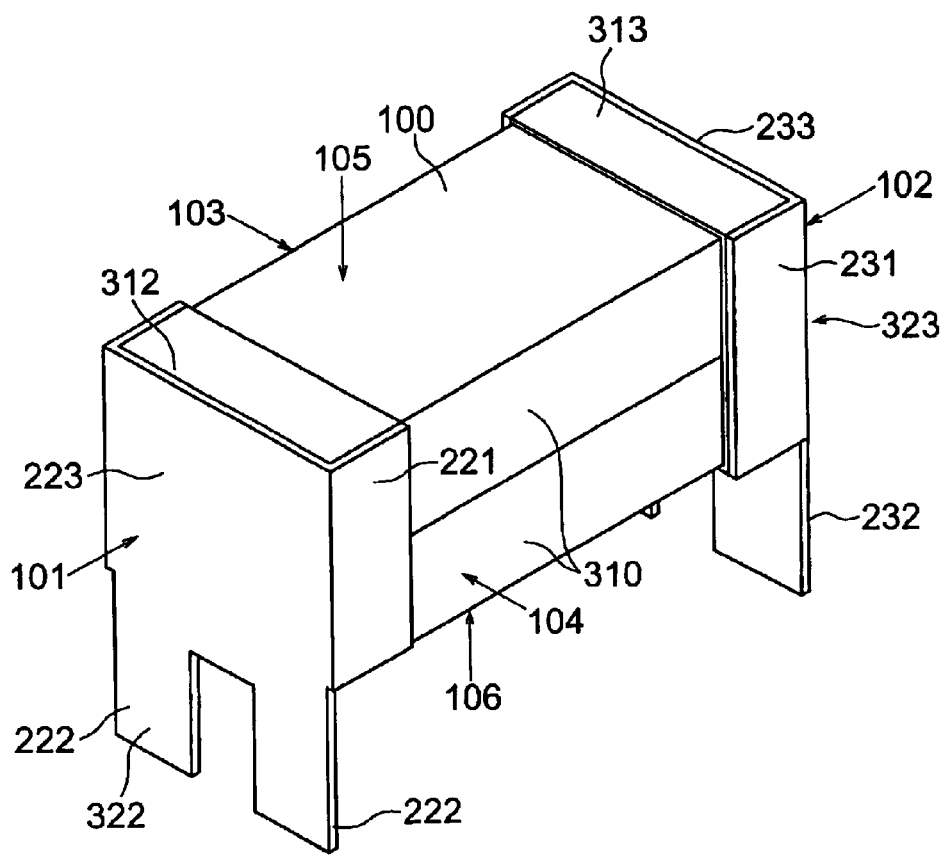

FIG. 30 is a perspective view of another embodiment. External terminals 322 and 323 have electrode connection parts 221 and 231 to be commonly connected to terminal electrodes 312 and 313 of two ceramic capacitors 310 and 310 at two side faces 103 and 104 of dielectric bodies 100 in the width direction. Further, external terminals 322 and 323 have end face connection pieces 223 and 233 to be commonly connected to terminal electrodes 312 and 313 of two ceramic capacitors 310 and 310 at end faces 101 and 102 of the dielectric bodies 100 in the length direction. Further, external connection parts 222 and 232 are formed on the same plane with respect to the end face connection pieces 223 and 233. They are provided as extensions of the end face connection pieces 223 and 233 and are branched into two directions.

As explained above, according to the present invention, it is possible to provide a ceramic capacitor provided with a structure suppressing the transmission of vibration to a circuit board etc. by a simple structure.

While the present invention was explained in detail above with reference to preferred embodiments, it is self evident to a person skilled in the art that various modifications are possible based on the basic technical idea and teachings of the present invention.

What is claimed is:

1. An electronic device comprising:
    a main body including a ceramic layer and an internal conductor layer,
    a terminal electrode formed at end face of the main body and connected to said internal conductor layer, and
    an external electrode comprised of a conductive sheet member formed with electrode connection part connected to the outer end face of said terminal electrode and external connection part able to be connected to an external circuit, wherein
    a width of said electrode connection part is narrower than a width of said external connection part and is narrower than a width of said terminal electrode,
    said external connection part is arranged so as to face a bottom surface of said main body by a predetermined separation distance from said main body, and,
    when a width dimension of said main body is W0 and a height dimension of said main body is T, said main body is designed so that the value of W0/T becomes one in the range of 0.8 to 1.2.

2. The electronic device as set forth in claim 1, wherein a ratio (W1/W) of a width dimension (W1) of said electrode connection part to a width dimension (W) of said terminal electrode is not more than 0.5.

3. The electronic device as set forth in claim 1, wherein when the length dimension of the entirety of said electronic device is L1 and the separation distance of said external connection part and the bottom surface of said main body is D, the value of D/L1 is in the range of 0.025 to 0.600.

4. The electronic device as set forth in claim 1, wherein said terminal electrode is provided at one of two end faces of said main body in the length direction and said external terminal is arranged so as to be connected to the terminal electrode.

5. The electronic device as set forth in claim 1, wherein the terminal electrode of said main body and the electrode connection part of said external terminal is connected by high temperature solder or a conductive adhesive.

6. The electronic device as set forth in claim 1, wherein the base part of said electrode connection part is provided with a bent part.

7. The electronic device as set forth in claim 1, wherein said electrode connection part is provided with a body support supporting said main body and/or the bottom surface of the terminal electrode.

8. The electronic device as set forth in claim 1, wherein said body support is formed by cutting and bending a part of said electrode connection part.

9. The electronic device as set forth in claim 1, wherein said electrode connection part is formed by bending into substantially U-shape.

10. The electronic device as set forth in claim 2, wherein said electrode connection part is connected at a substantial center of said terminal electrode in the width direction along a height direction of said terminal electrode.

11. The electronic device as set forth in claim 2, wherein a top end of the electrode connection part is provided with a guide piece, for facilitating positioning with said main body, formed bent along a top surface of said main body.

12. The electronic device as set forth in claim 10, wherein the width of the external connection part is substantially the same as the width of said terminal electrode.

13. The electronic device as set forth in claim 10, wherein said body support is formed at each of two sides of said electrode connection part and is obtained by bending said conductive sheet member forming said external terminal to substantially right angle with respect to said electrode connection part.

14. The electronic device as set forth in claim 12, wherein said body support is formed by bending said electrode connection part in step-wise shapes.

15. An electronic device comprising:
a main body including a plurality of internal conductor layers stacked via ceramic layers,
a pair of terminal electrodes formed at two ends of said main body in a longitudinal direction and selectively connected to said internal conductor layers, and
a pair of external terminals connected to said terminal electrodes, wherein
each of said terminal electrodes has at least an electrode end face positioned at an end face of said main body in the longitudinal direction and an electrode side face formed at a side face of said main body in a width direction so as to continue from said electrode end face to the side face, and
each of said external terminals comprises a conductive sheet member formed with an electrode connection part connected to at least the electrode side face of said terminal electrode and an external connection part able to be connected to an external circuit,
wherein a width of said electrode side face of said terminal electrode is a length of 5% to 20% with respect to a length of said main body, and the width of said external terminal is equal to or less than the width of said electrode side face.

16. An electronic device comprising:
a main body including a plurality of internal conductor layers stacked via ceramic layers,
a pair of terminal electrodes formed at two ends of said main body in a longitudinal direction and selectively connected to said internal conductor layers, and
a pair of external terminals connected to said terminal electrodes, wherein each of said terminal electrodes has at least an electrode end face positioned at an end face of said main body in the longitudinal direction and an electrode side face formed at a side face of said main body in a width direction so as to continue from said electrode end face to the side face, and
each of said external terminals comprises a conductive sheet member formed with an electrode connection part connected to at least the electrode side face of said terminal electrode and an external connection part able to be connected to an external circuit,
wherein when a length dimension of said electronic device is L1 and a separation distance between said external connection part and a bottom surface of said main body is D, the value of D/L1 falls in the range of 0.025 to 0.600.

17. An electronic device comprising:
a main body including a plurality of internal conductor layers stacked via ceramic layers,
a pair of terminal electrodes formed at two ends of said main body in a longitudinal direction and selectively connected to said internal conductor layers, and
a pair of external terminals connected to said terminal electrodes, wherein
each of said terminal electrodes has at least an electrode end face positioned at an end face of said main body in the longitudinal direction and an electrode side face formed at a side face of said main body in a width direction so as to continue from said electrode end face to the side face, and
each of said external terminals comprises a conductive sheet member formed with an electrode connection part connected to at least the electrode side face of said terminal electrode and an external connection part able to be connected to an external circuit, wherein:
a width of said electrode side face of said terminal electrode is a length of 5% to 20% with respect to a length of said main body, and
said terminal electrode further comprises a top surface positioned at a top surface of the main body in a height direction, and
the electrode connection part of the external terminal further comprises a top surface connection piece to be connected to the electrode top surface of said terminal electrode.

18. The electronic device as set forth in claim 17, wherein said terminal electrode further comprises an electrode bottom surface positioned at a bottom surface of said main body in a height direction.

19. The electronic device as set forth in claim 18, wherein a width of said electrode top surface and electrode bottom surface are substantially equal to said electrode side face.

20. An electronic device comprising:
a main body including a plurality of internal conductor layers stacked via ceramic layers,
a pair of terminal electrodes formed at two ends of said main body in a longitudinal direction and selectively connected to said internal conductor layers, and
a pair of external terminals connected to said terminal electrodes, wherein
each of said terminal electrodes has at least an electrode end face positioned at an end face of said main body in the longitudinal direction and an electrode side face formed at a side face of said main body in a width direction so as to continue from said electrode end face to the side face, and each of said external terminals comprises a conductive sheet member formed with an electrode connection part connected to at least the electrode side face of said terminal electrode and an external connection part able to be connected to an external circuit, wherein when a width dimension of said main body is W0 and a height dimension of said main body is T, W0/T is in a range of 0.8 to 1.2.

21. An electronic device comprising:

a main body including a plurality of internal conductor layers stacked via ceramic layers, a pair of terminal electrodes formed at two ends of said main body in a longitudinal direction and selectively connected to said internal conductor layers, and a pair of external terminals connected to said terminal electrodes, wherein each of said terminal electrodes has at least an electrode end face positioned at an end face of said main body in the longitudinal direction and an electrode side face formed at a side face of said main body in a width direction so as to continue from said electrode end face to the side face, and each of said external terminals comprises a conductive sheet member formed with an electrode connection part connected to at least the electrode side face of said terminal electrode and an external connection part able to be connected to an external circuit, wherein the electrode connection part of said external terminal is connected to electrode side faces of terminal electrodes of a plurality of other main bodies stacked with the main body along a height direction; and when a width dimension of said main bodies is W0 and a total height dimension of the main body and the plurality of other main bodies is T, W0/T is in a range of 0.8 to 1.2.

* * * * *